(12) United States Patent
Lin et al.

(10) Patent No.: US 11,778,815 B2
(45) Date of Patent: Oct. 3, 2023

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Meng-Han Lin, Hsinchu (TW); Te-An Chen, Beitun District (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/833,834

(22) Filed: Jun. 6, 2022

(65) Prior Publication Data

US 2022/0320130 A1 Oct. 6, 2022

Related U.S. Application Data

(63) Continuation of application No. 16/887,749, filed on May 29, 2020, now Pat. No. 11,355,507.

(51) Int. Cl.
| | |
|---|---|
| *H10B 41/27* | (2023.01) |
| *H01L 21/033* | (2006.01) |
| *H01L 29/06* | (2006.01) |
| *H10B 43/27* | (2023.01) |

(52) U.S. Cl.
CPC ......... *H10B 41/27* (2023.02); *H01L 21/0337* (2013.01); *H01L 29/0649* (2013.01); *H10B 43/27* (2023.02)

(58) Field of Classification Search
None
See application file for complete search history.

(56) References Cited

U.S. PATENT DOCUMENTS

| | | |
|---|---|---|
| 2016/0104671 A1 | 4/2016 | Cho et al. |
| 2019/0165115 A1* | 5/2019 | Lin ................... H01L 29/42344 |
| 2020/0058664 A1 | 2/2020 | Lin et al. |

(Continued)

FOREIGN PATENT DOCUMENTS

TW 201926641 A 7/2019

OTHER PUBLICATIONS

Non-Final Office Action issued in U.S. Appl. No. 16/887,749, dated Jul. 20, 2021.

(Continued)

*Primary Examiner* — Hsien Ming Lee
(74) *Attorney, Agent, or Firm* — McDermott Will & Emery LLP

(57) ABSTRACT

In a method of manufacturing a semiconductor device, a memory cell structure covered by a protective layer is formed in a memory cell area of a substrate. A mask pattern is formed. The mask pattern has an opening over a first circuit area, while the memory cell area and a second circuit area are covered by the mask pattern. The substrate in the first circuit area is recessed, while the memory cell area and the second circuit area are protected. A first field effect transistor (FET) having a first gate dielectric layer is formed in the first circuit area over the recessed substrate and a second FET having a second gate dielectric layer is formed in the second circuit area over the substrate as viewed in cross section.

20 Claims, 37 Drawing Sheets

(56) References Cited

U.S. PATENT DOCUMENTS

2020/0058665 A1    2/2020  Lin et al.
2021/0013220 A1    1/2021  Lin et al.

OTHER PUBLICATIONS

Final Office Action issued in U.S. Appl. No. 16/887,749, dated Oct. 28, 2021.
Notice of Allowance issued in U.S. Appl. No. 16/887,749, dated Feb. 1, 2022.

\* cited by examiner

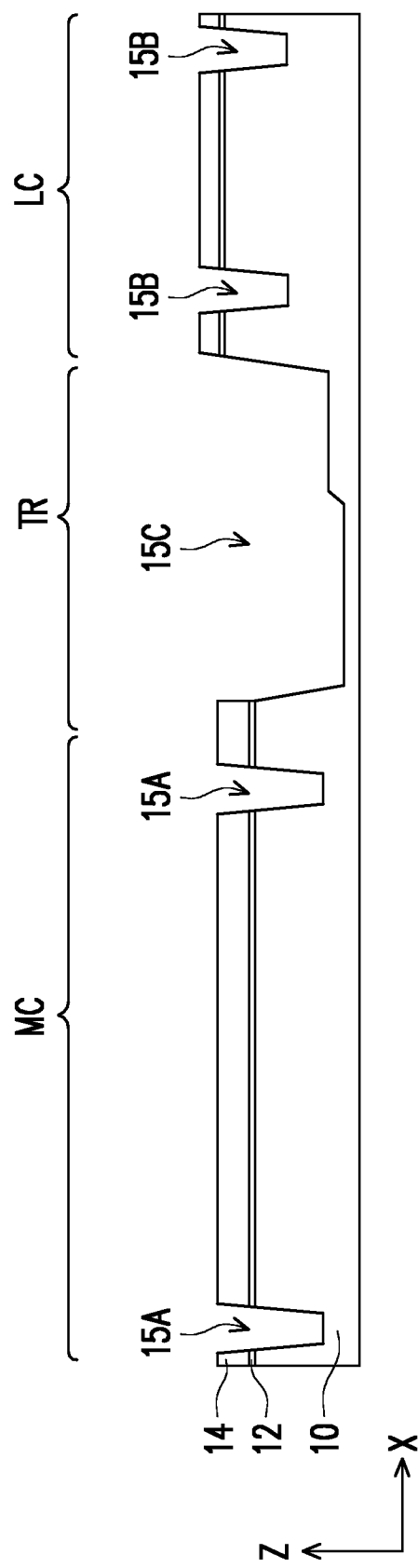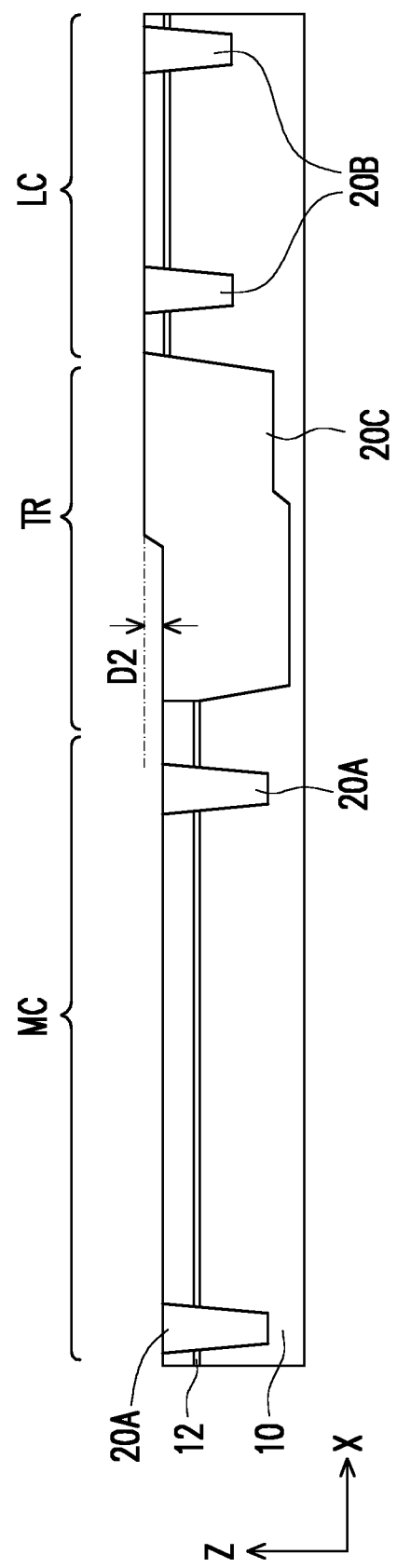

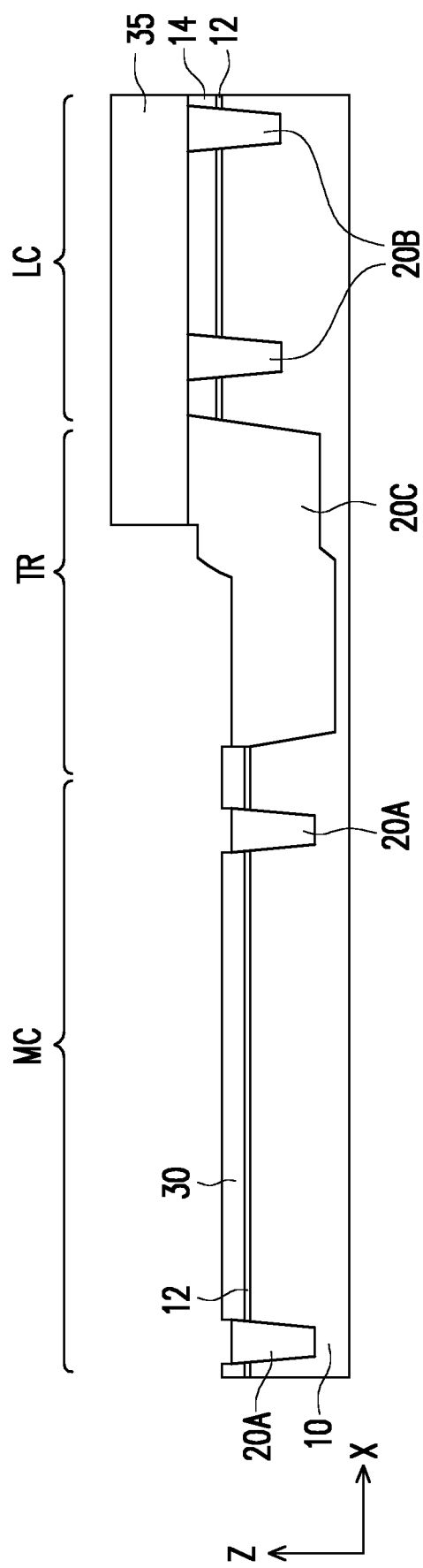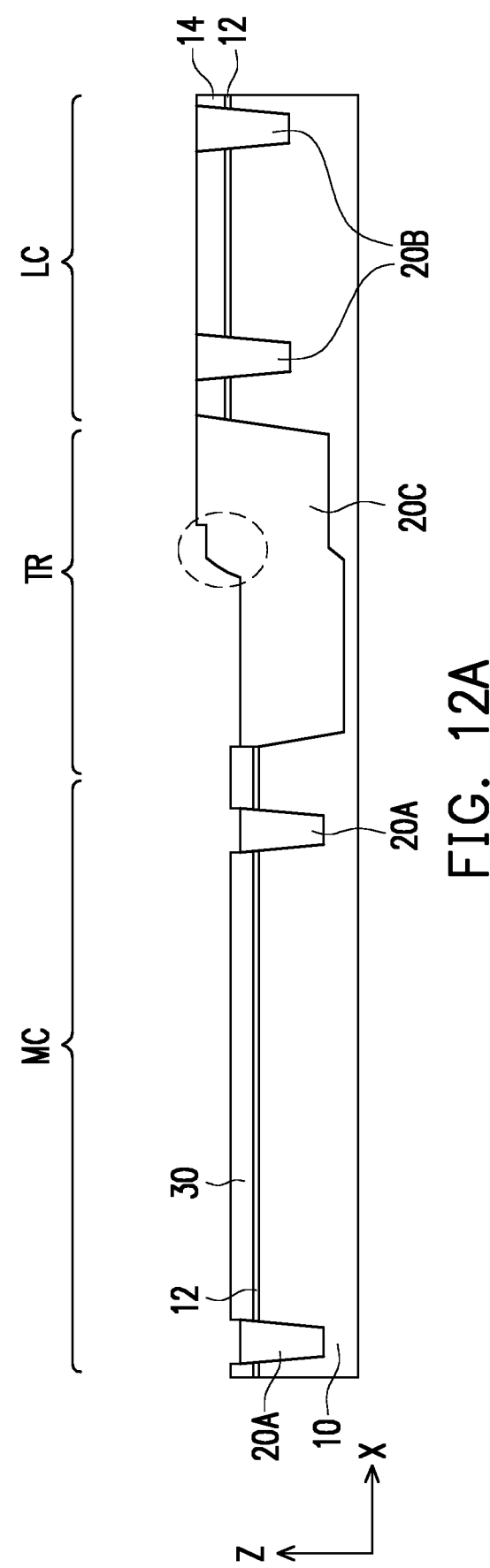
FIG. 11
FIG. 12A

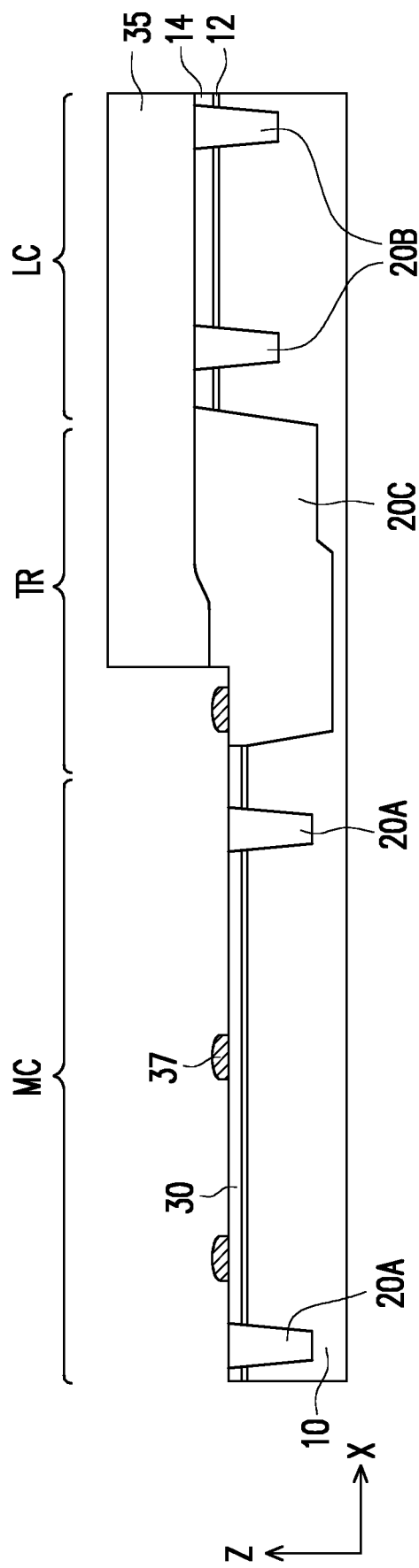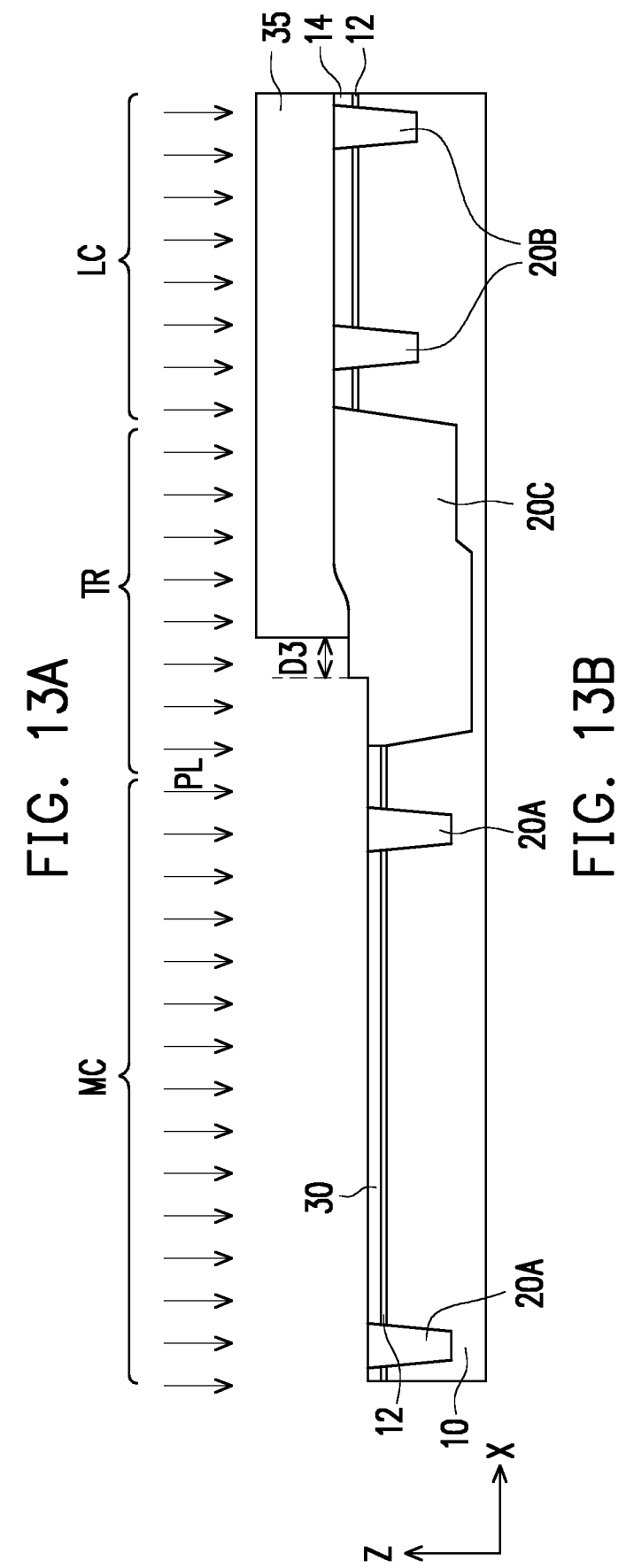
FIG. 13A
FIG. 13B

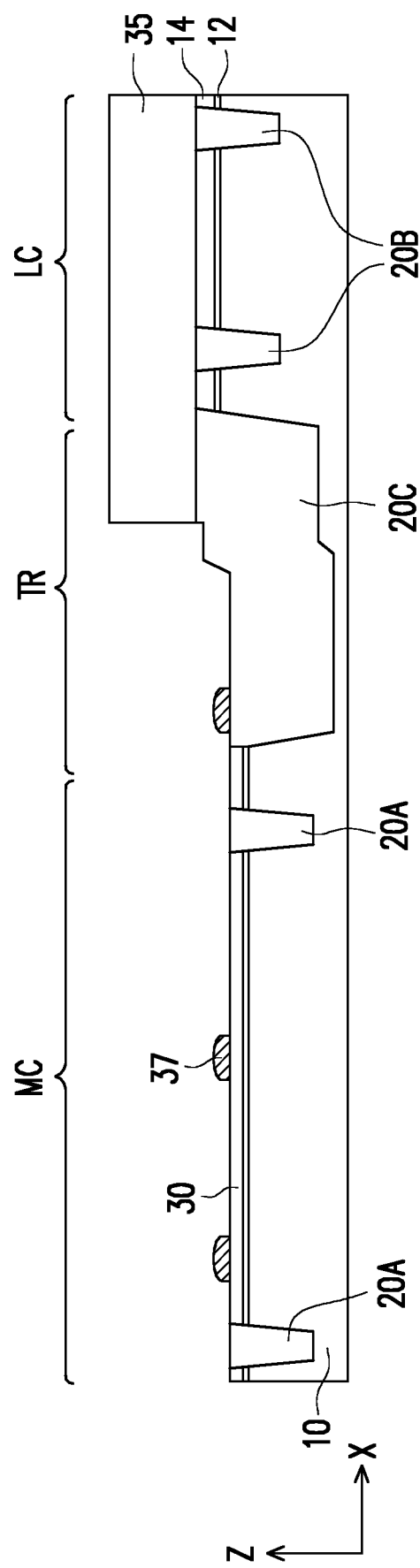
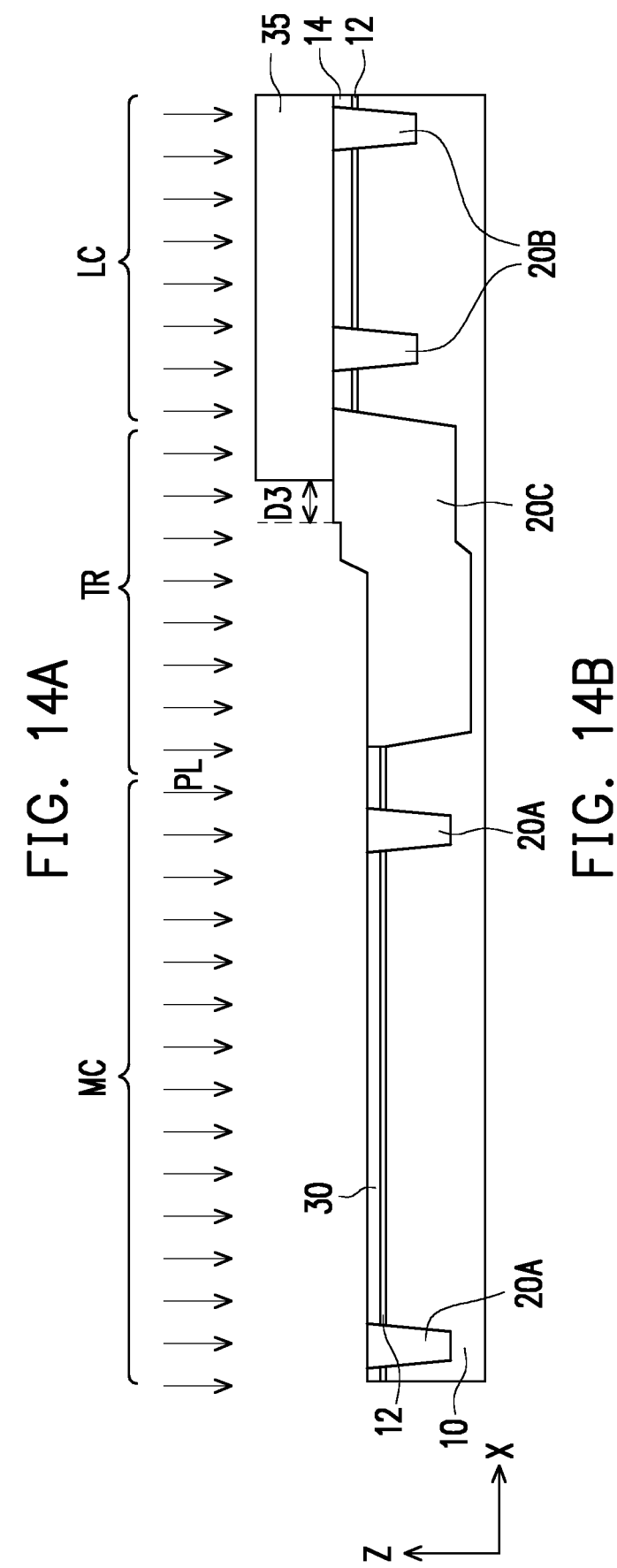
FIG. 14A
FIG. 14B

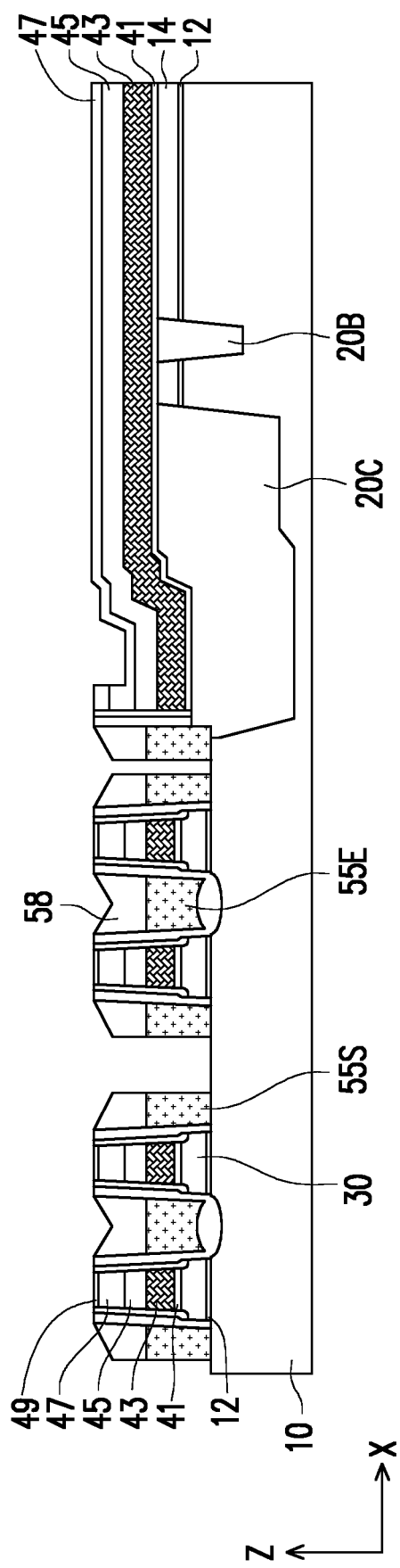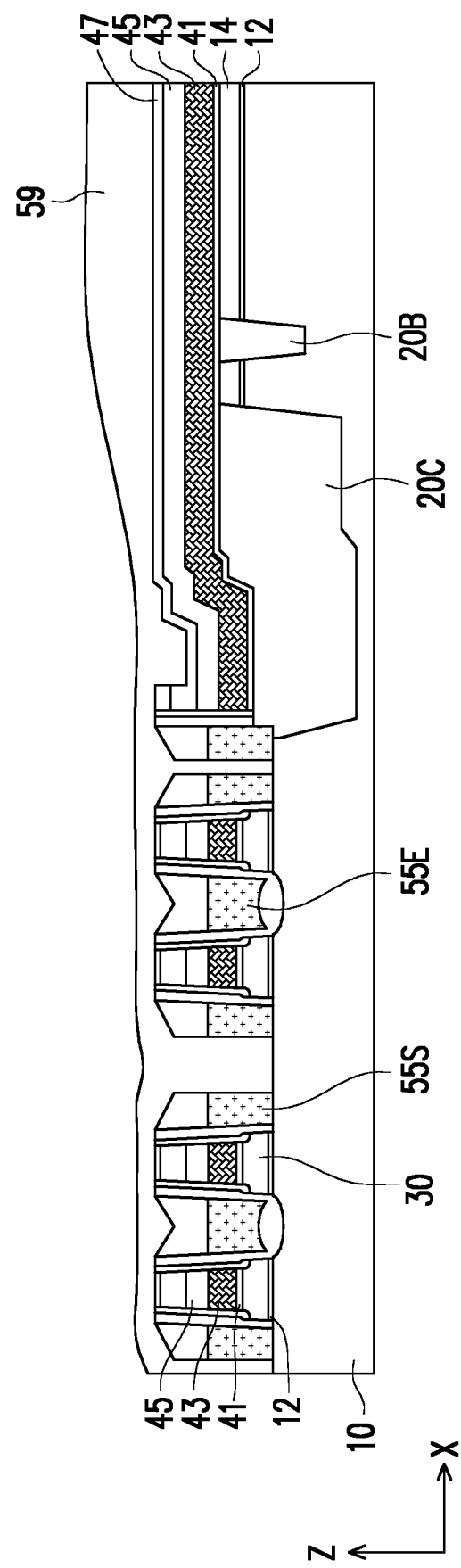

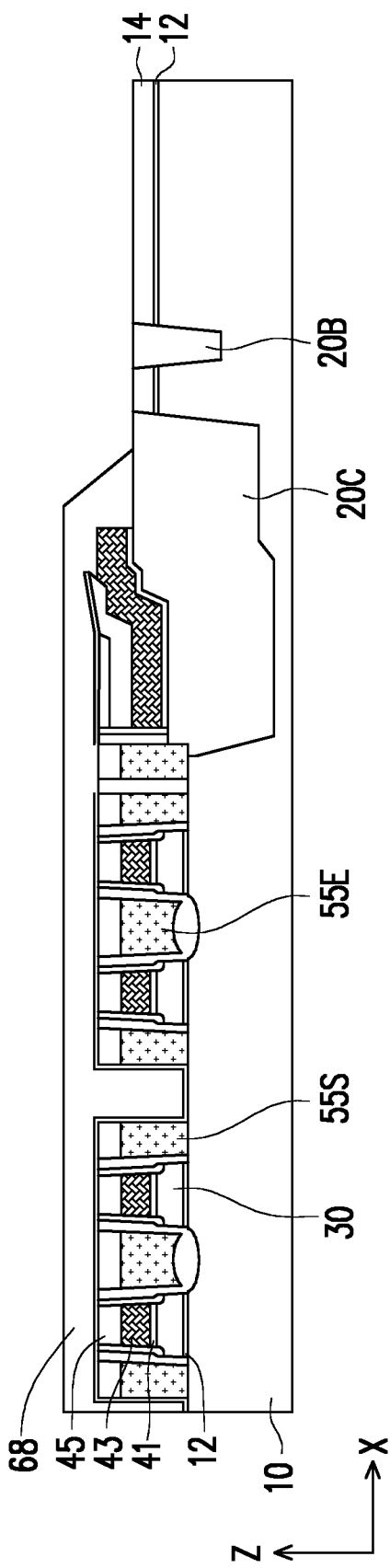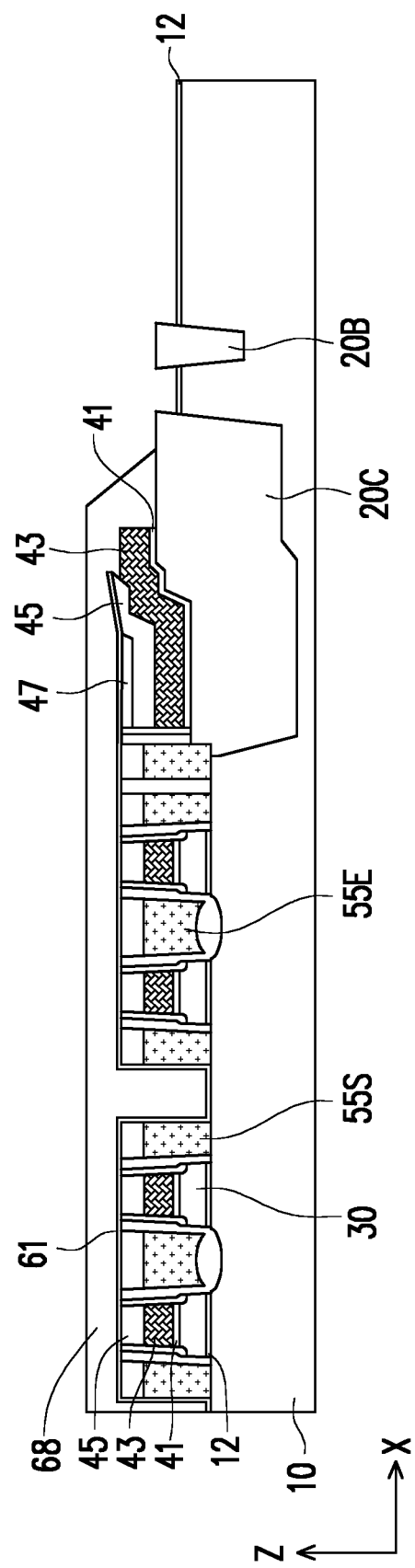

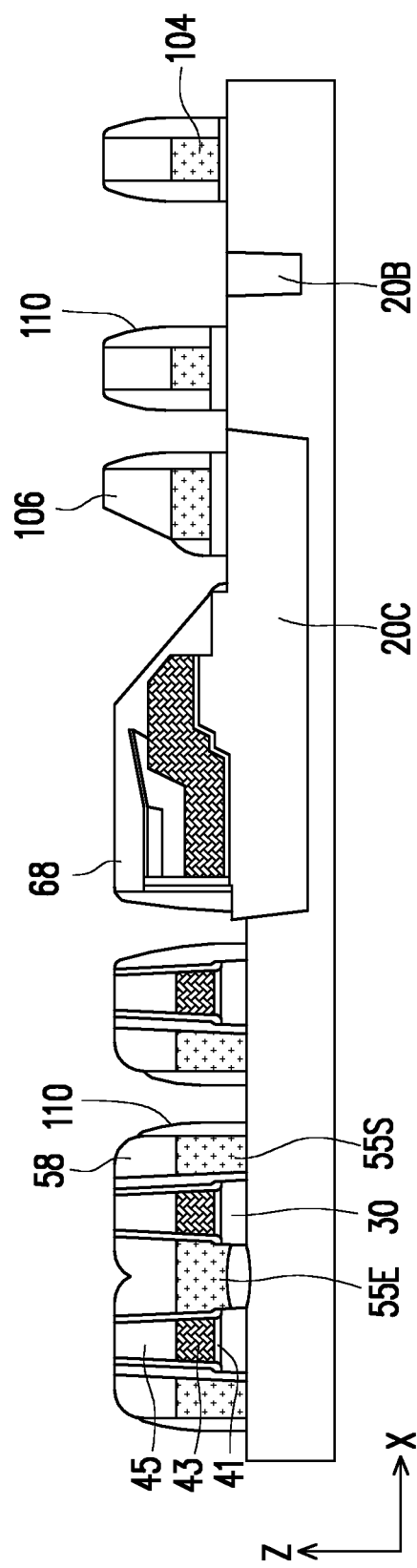
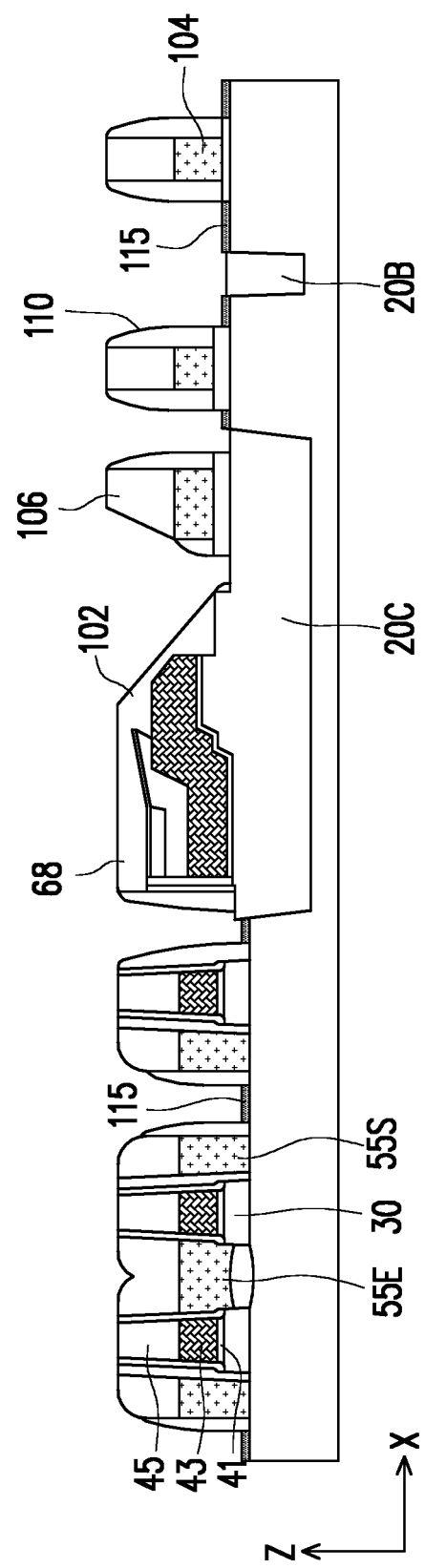

SEMICONDUCTOR DEVICE AND MANUFACTURING METHOD THEREOF

RELATED APPLICATION

This application is a continuation of U.S. patent application Ser. No. 16/887,749 filed May 29, 2020, now U.S. Pat. No. 11,355,507, the entire contents of which are incorporated herein by reference.

BACKGROUND

Flash memories are embedded in advanced logic CMOS (complementary metal-oxide-semiconductor) devices, which are used for a smart card, a mobile device and an automotive application. As the semiconductor industry has progressed into nanometer technology process nodes in pursuit of higher device density, higher performance, and lower costs, there have been challenges in controlling flatness of an underlying layer in view of lithography operations. In particular, in a CMOS device with a flash memory, chemical mechanical polishing operations have played an important role in planarizing the underlying layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5, 6, 7, 8, 9, 10 and 11 show cross sectional views illustrating various stages of a sequential process for manufacturing a semiconductor device including the NVM area and the circuit areas according to an embodiment of the present disclosure.

FIGS. 12A, 12B and 12C show cross sectional views illustrating one of various stages of a sequential process for manufacturing a semiconductor device including the NVM area and the circuit areas according to an embodiment of the present disclosure.

FIGS. 13A, 13B, 13C, 13D and 13E show cross sectional views illustrating various stages of a sequential process for manufacturing a semiconductor device including the NVM area and the circuit areas according to another embodiment of the present disclosure.

FIGS. 14A, 14B, 14C, 14D and 14E show cross sectional views illustrating various stages of a sequential process for manufacturing a semiconductor device including the NVM area and the circuit areas according to another embodiment of the present disclosure.

FIGS. 16, 17, 18, 19, 20, 21, 22, 23, 24, 25, 26, 27, 28, 29, 30, 31, 32, 33, 34, 35, 36, 37, 38 and 39 show cross sectional views illustrating various stages of a sequential process for manufacturing a semiconductor device including the NVM area and the circuit areas according to an embodiment of the present disclosure.

FIGS. 40, 41, 42, 43, 44, 45, 46, 47, 48, 49, 50, 51, 52, 53, 54, 55 and 56 show cross sectional view illustrating various stages of a sequential process for manufacturing a semiconductor device including the NVM area and the circuit areas according to an embodiment of the present disclosure.

DETAILED DESCRIPTION

Figure 1:
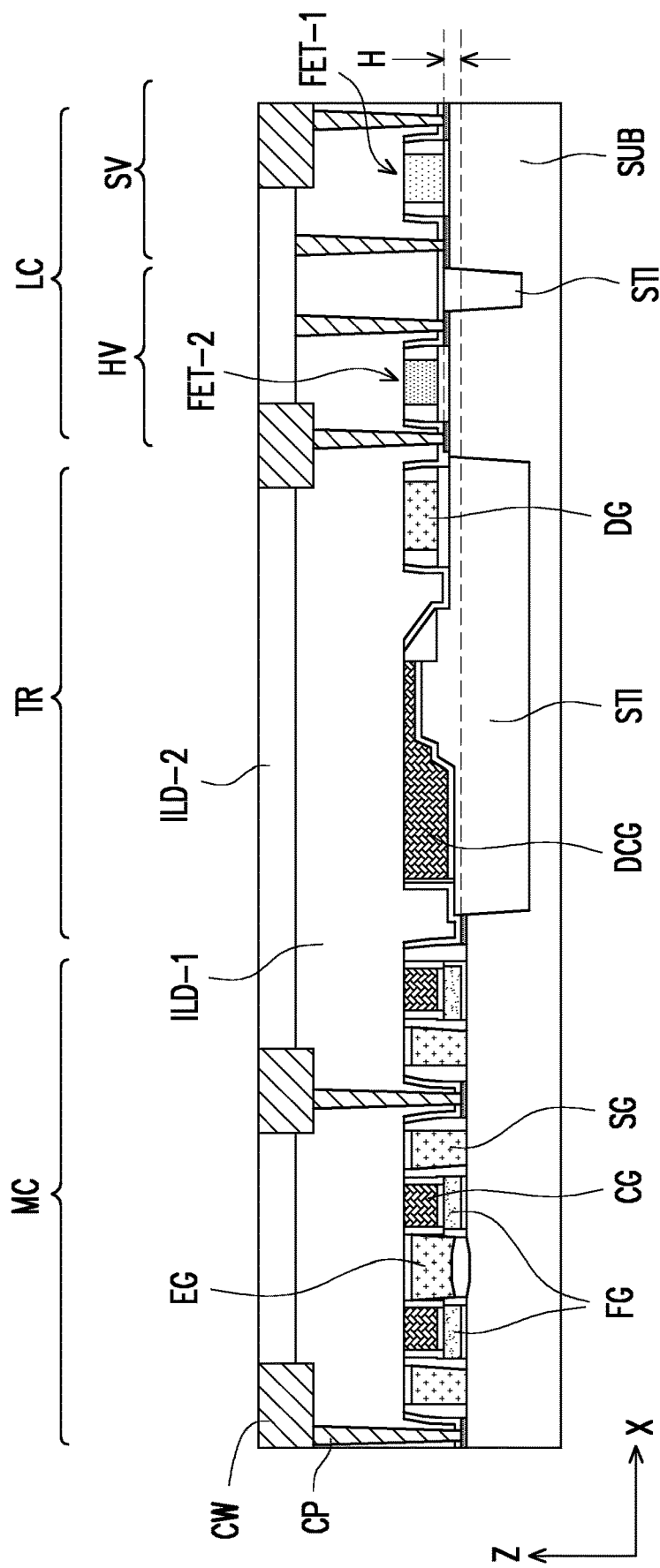
FIG. 1 shows a cross sectional view of a semiconductor device including a non-volatile memory (NVM) area and circuit areas of various operation voltages according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the present disclosure, a semiconductor device includes non-volatile memory (NVM) cells for a flash memory and peripheral logic circuits (e.g., drivers, decoders, I/O circuits and/or logic circuits). The NVM cells require a stacked structure in which plural layers, such as polysilicon layers, are stacked, while the peripheral circuits include field effect transistors (FETs) having a height smaller than the NVM cells in some embodiments. Because of the structure differences, when, for example, a conductive material layer for a gate structure and/or an interlayer dielectric (ILD) layer are formed over the NVM cells and the peripheral circuits, there is a height difference in the ILD layer between an NVM cell area and a peripheral circuit area. Such a height difference may affect the performance of a planarization process, such as a CMP process and an etch-back process, on the conductive material layer and/or the ILD layer.

In the present disclosure, before fabricating the NVM cells and the peripheral devices, a substrate in the NVM cell area is etched to make a "step" between the NVM cell area and the peripheral logic circuit area. Further, an additional cleaning operation is employed to remove residual polymers produced in an etch-back process in the present disclosure.

FIG. 1 shows a cross sectional view of a semiconductor device including a non-volatile memory (NVM) area and logic circuit areas according to an embodiment of the present disclosure.

The semiconductor device includes an NVM area MC and a logic circuit area LC disposed over a substrate SUB, as shown in FIG. 1. Each area is isolated by an isolation insulating layer STI, such as a shallow trench isolation (STI), from the adjacent area. The logic circuit area includes a plurality of CMOS transistors. In some embodiments, the logic circuit area LC includes a high voltage transistor area HV including one or more FETs FET-2 and a standard voltage transistor area SV including one or more FETs FET-1. Although FIG. 1 illustrates a one gate (FET) in each of the areas HV and SC, the number of FETs is more than one in some embodiments.

In the NVM area MC, a plurality of NVM cells are disposed. A pair of NVM cells is shown in FIG. 1, but more than two NVM cells can be included in the NVM area MC. The NVM cells include a floating gate FG, a control gate CG, a select gate SG and an erase gate EG. One or more contacts are also disposed passing through one or more interlayer dielectric layer. One or more interlayer dielectric layers ILD-1 and ILD-2 are disposed over the NVM cells and the FETs. A contact plug CP connects the lower conductive areas (e.g., source/drain regions, gate electrodes, etc.) and a wring CW.

As shown in FIG. 1, the upper surface of the substrate SUB in the NVM area MC is lower than the upper surface of the logic circuit area LC by a distance H.

The upper surface of the NVM area MC (a memory cell forming surface) is defined as the interface between a dielectric layer under the floating gate FG in direct contact with the substrate and the substrate in the NVM area MC, and the upper surfaces of the logic circuit area (a device forming surface) is defined as the interface between a gate dielectric layer in direct contact with the substrate and the substrate (an upper surface of a channel). In the present disclosure, "upper" and "lower" are used to define a relative position along the Z direction (the normal direction of the substrate), and the "upper" level is farther from the substrate than the "lower" level. In other words, the "lower" level is closer to the backside of the substrate than the "upper" level. In this disclosure, "dummy" generally means a layer that is subsequently removed or replaced with another material, or a layer which does not function as a part of an active circuit. However, even if not mentioned as dummy, some layers may be subsequently replaced with another layer/material.

In some embodiments, H is in a range from about 10 nm to about 150 nm, and on other embodiments, H is in a range from about 20 nm to about 75 nm.

As shown in FIG. 1, a transition area TR is disposed between the NVM cell area MC and the logic circuit area LC, and includes an isolation insulating layer STI. In some embodiments, the transition area surrounds the NVM cell area MC in plan view. The isolation insulating layer STI in the transition area TR has multiple steps (e.g., two steps) at the side of the NVM area MC in some embodiments, as shown in FIG. 1. In some embodiments, the isolation insulating layer STI in the transition area TR has one step, as shown in FIG. 1.

Further, in some embodiments, a dummy control gate DCG and a dummy gate DG are disposed over the isolation insulating layer STI in the transition area TR.

In some embodiments, the upper surface of the isolation insulating layer STI includes one or more first steps and one or more first slopes, which are covered by an ONO film that is the same as an ONO film disposed between a floating gate and a control gate of the NVM cell. Further, as shown in FIG. 1, the first step and the first slope are further covered by a polysilicon layer disposed on the ONO layers. In some embodiments, the upper surface of the isolation insulating layer STI further includes one or more second steps, which are not covered by the one or more dielectric layers.

FIGS. 2-39 show cross sectional views illustrating various stages of a sequential manufacturing process for a semiconductor device including a NVM area and a logic circuit areas according to an embodiment of the present disclosure. It is understood that additional operations can be provided before, during, and after processes shown by FIGS. 2-39, and some of the operations described below can be replaced or eliminated, for additional embodiments of the method. The order of the operations may be changed.

Figure 2:
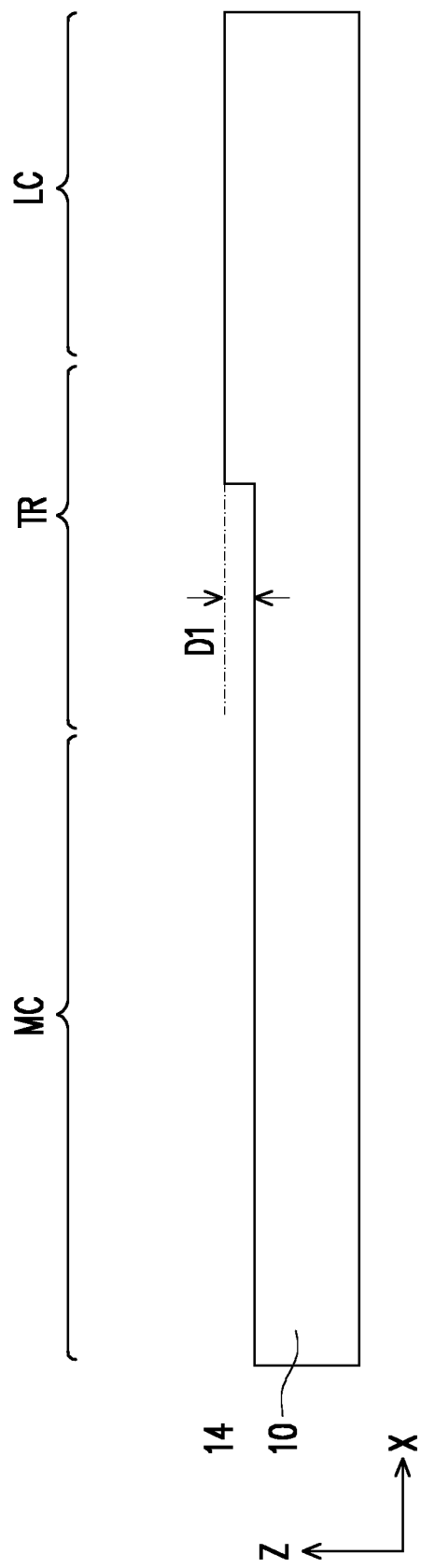

As shown in FIG. 2, a step is formed in the upper surface of a substrate 10. In some embodiments, the substrate 10 is a silicon wafer. In other embodiments, the substrate 10 includes SiGe, SiC, or a Group III-V semiconductor.

In some embodiments, the step is formed by local oxidation and removal. In some embodiments, a silicon oxide layer is formed on the substrate and a silicon nitride layer is formed on the silicon oxide layer. The silicon nitride layer is patterned by using a photo-etching operation, and then, the NVM cell area MC is thermally oxidized by using wet oxidation, thereby forming an oxide layer (so-called, "LOCOS"). The oxide layer is removed by wet etching, and then the silicon nitride layer and the silicon oxide layer are removed, thereby forming the step. The step can be formed by one or more etching operations. In some embodiments, the substrate in the NVM area is selectively etched by a plasma dry etching. The step height D1 is in a range from about 10 nm to about 150 nm in some embodiments.

Figure 3:
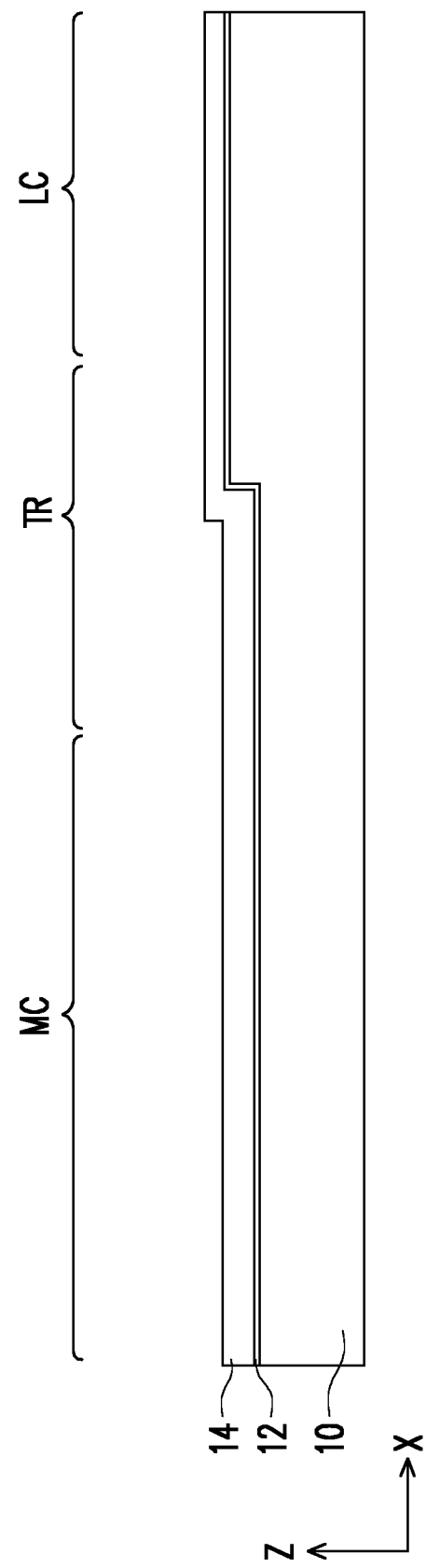

After the "step" is formed, isolation insulating layers (STIs) are formed. To form the isolation insulating layers, a mask layer including a silicon oxide layer 12 and a silicon nitride layer 14 is formed on the substrate 10, as shown in FIG. 3. In some embodiments, an etch-back operation is performed on the silicon nitride layer 14.

Then, the mask layer is patterned by one or more lithography and etching operations. Then, by using the patterned mask layer as an etching mask, the substrate 10 is trench-etched to form trenches as shown in FIG. 4. A depth of the trenches is in a range from about 100 nm to about 1 μm in some embodiments. In some embodiments, the NVM cell area MC includes trenches 15A, the logic circuit area LC includes trenches 15B and the transition area TR includes a trench 15C as shown in FIG. 4.

The trenches are filled with an insulating (dielectric) material, and then, a planarization operation, such as CMP or an etch-back process, is performed so as to remove an upper part of the insulating material layer, thereby forming the isolation layers 20A, 20B and 20C, as shown in FIG. 5. In some embodiments, the silicon nitride layer 14 functions as a CMP stopper layer, and thus the CMP operation substantially stops on the silicon nitride layer 14. After the CMP operation, the isolation insulating layer 20C in the transition area TR includes a step. In some embodiments, the step height D2 is in a range from about 5 nm to about 150 nm in some embodiments. In some embodiments, the step height D2 is smaller than D1.

Figure 6:
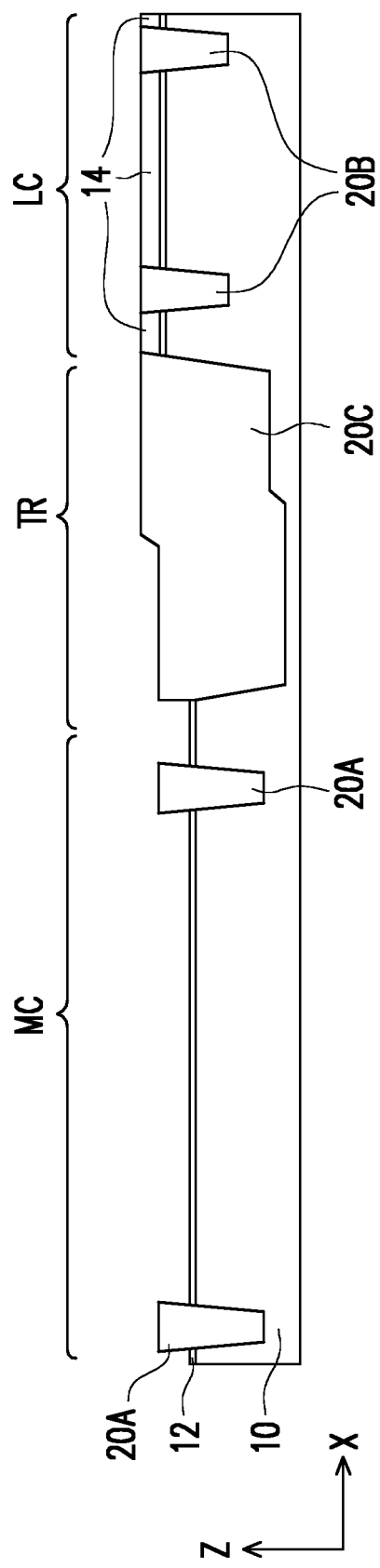

After the CMP operation, the silicon nitride layer 14 in the NVM cell area MC is removed as shown in FIG. 6. In some embodiments, a wet etching operation using $H_3PO_4$ is used. In some embodiments, the silicon oxide layer 12 remains, and in other embodiments, the silicon oxide layer 12 is removed and then a new silicon oxide layer (or any suitable silicon dielectric layer) is formed in the NVM cell area MC. The thickness of the dielectric layer (silicon oxide layer) 12 is in a range from about 1 nm to about 50 nm in some embodiments.

In the following description, the same reference numeral 12 is used for the remaining silicon oxide layer and the newly formed dielectric (silicon oxide) layer, as a first dielectric layer.

Figure 7:
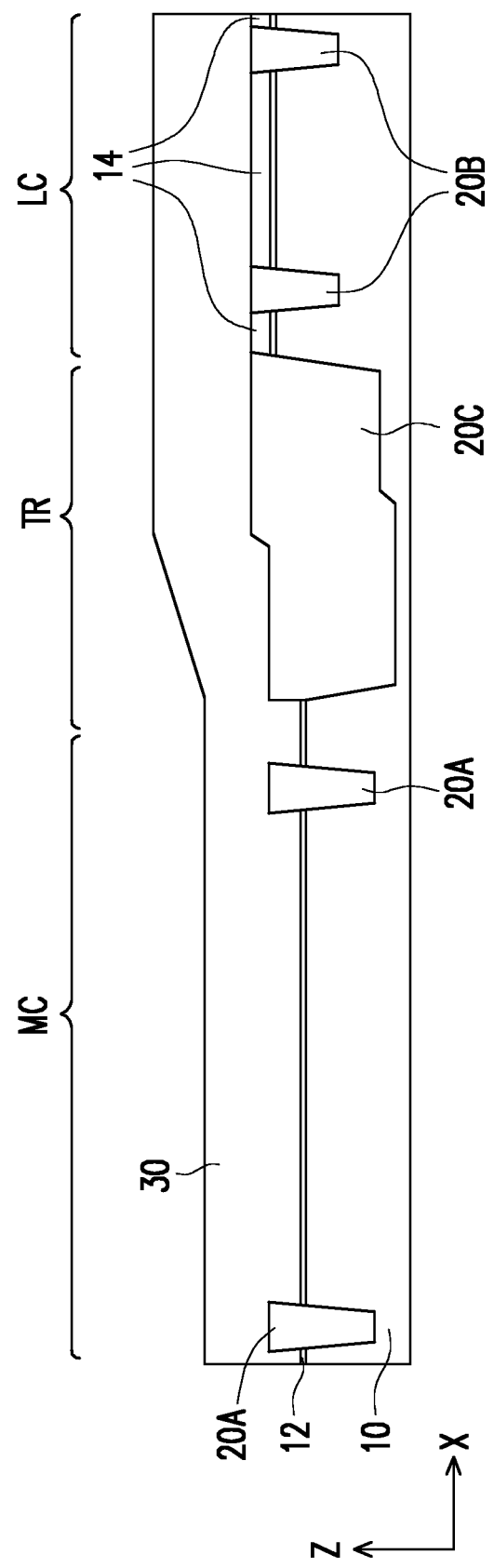

Then, as shown in FIG. 7, a first polysilicon layer 30 for a floating gate is formed over the first dielectric layer 12, the isolation insulating layer 20C in the transition area TR and the silicon nitride layer 14 in the logic circuit area LC. In some embodiments, the first polysilicon layer 30 can be formed by CVD. The thickness of the first polysilicon layer 30 as deposited is in a range from about 10 nm to about 300 nm in some embodiments.

Figure 8:
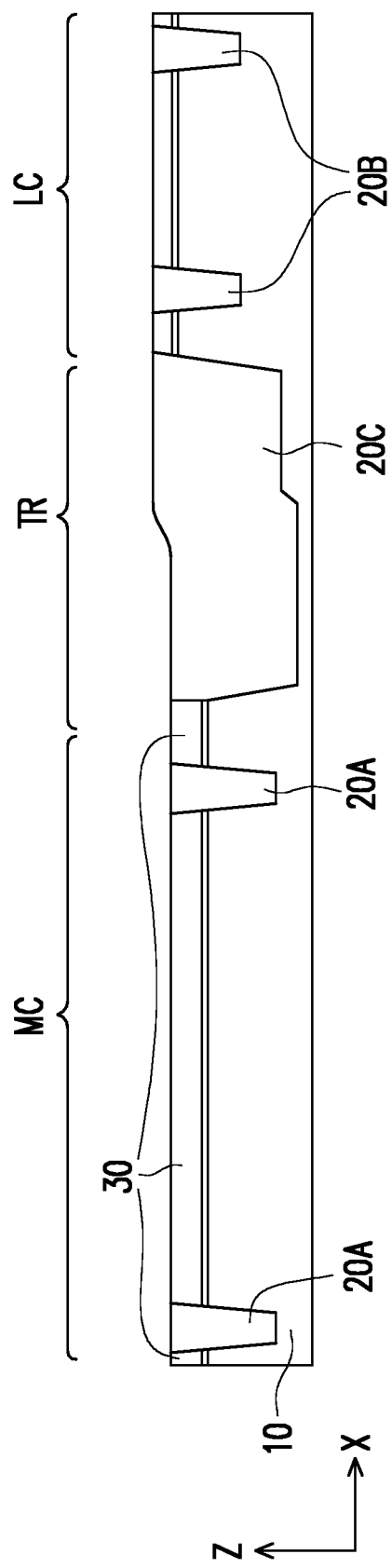

Then, the thickness of the first polysilicon layer 30 is reduced by a planarization operation, such as a CMP process, as shown in FIG. 8. In some embodiments, the silicon nitride layer 14 in the logic circuit area LC and the isolation insulating layers 20A and 20C function as a CMP stopper layer, and thus the CMP operation substantially stops on the silicon nitride layer 14 and the isolation insulating layers 20A and 20C. In some embodiments, over etching by the CMP operation is avoided to prevent damage to the logic circuit area LC.

Figure 9:
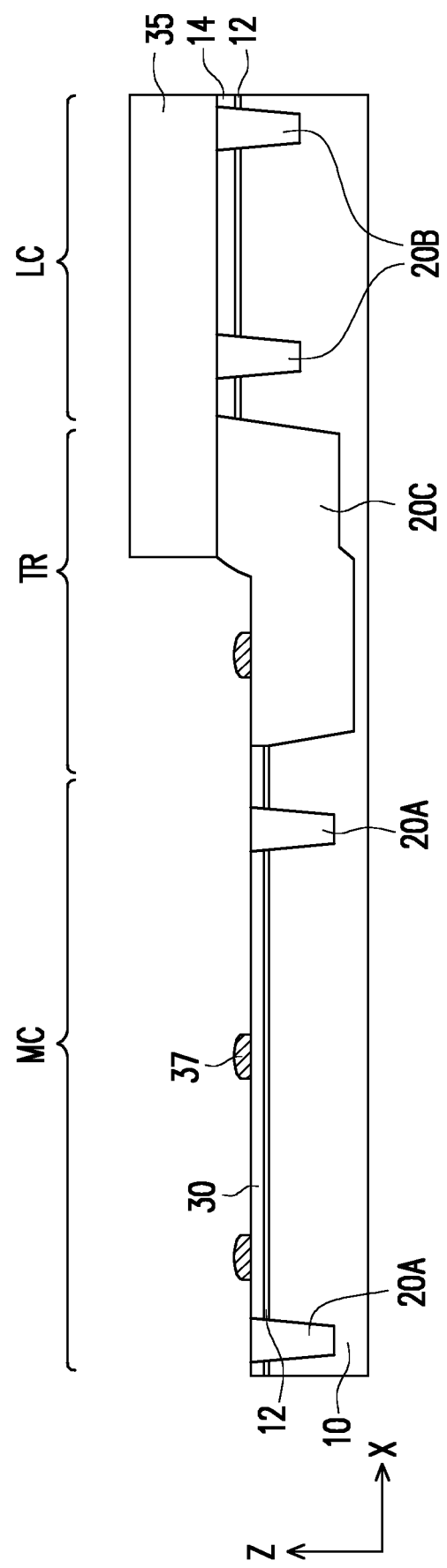

After the CMP operation, the thickness of the first polysilicon layer 30 in the NVM cell area MC is further reduced by an etch-back operation to obtain a desired thickness for the floating gate. In some embodiments, as shown in FIG. 9, a photo resist layer 35 is formed to cover the logic circuit area LC and a part of the transition area TR as shown in FIG. 9. Then, a plasma etch-back operation is performed to reduce the thickness of the first polysilicon layer 30. In some embodiments, the thickness of the isolation insulating layers 20A and 20C is also reduced.

In some embodiments, as shown in FIG. 9, polymer residues 37 caused from the photo resist and/or as etching by-products remain over the etched surface of the first polysilicon layer 30 and the isolation insulating layers.

Figure 10:
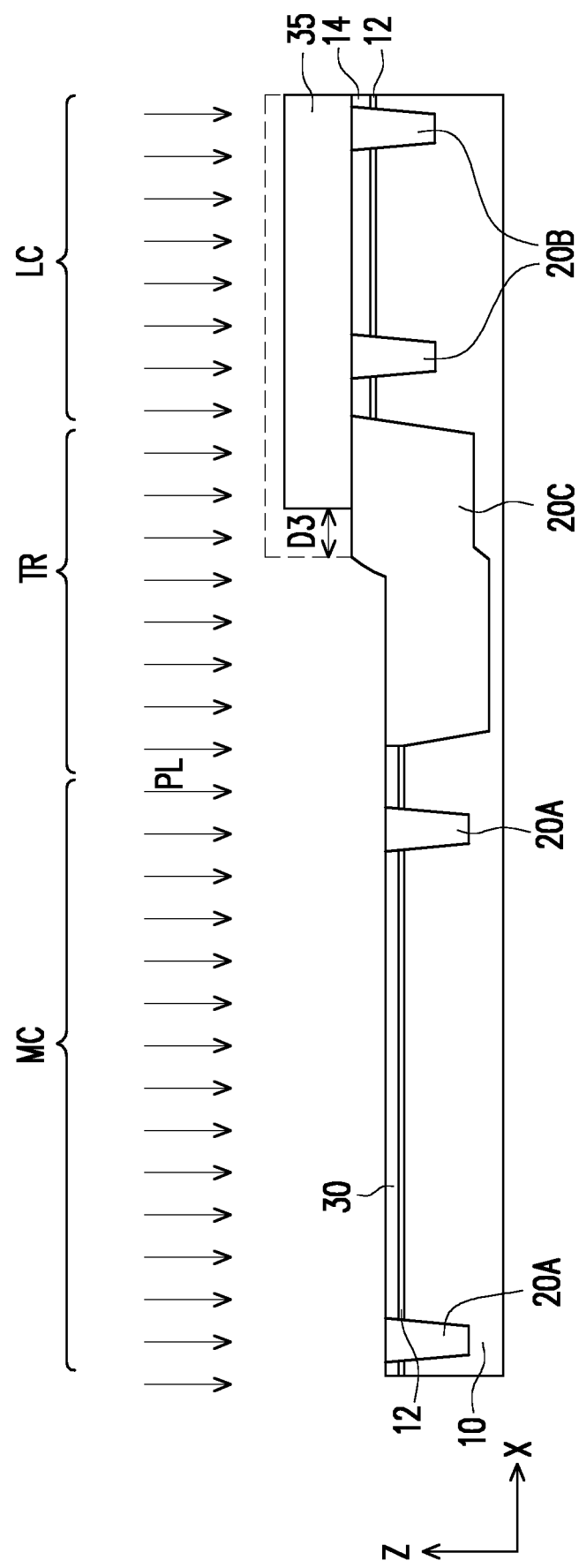

Then, as shown in FIG. 10, a cleaning operation to remove the polymer residues 35 is performed. In some embodiments, the cleaning operation includes a plasma cleaning PL. During the plasma cleaning operation, the photo resist layer 35 shrinks as shown in FIG. 10. The shrinkage amount D3 is in a range from about 1 nm to about 100 nm in some embodiments.

Figure 12B:
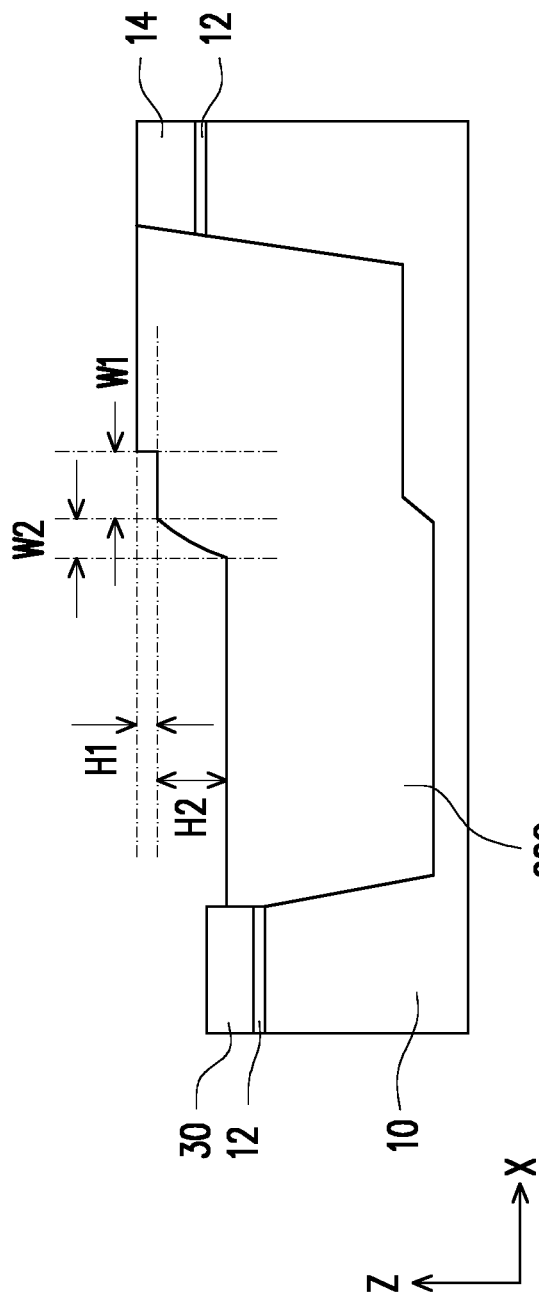

After the plasma cleaning operation, an additional wet cleaning operation is performed. The wet cleaning operation includes a HF or buffered HF (BHF) treatment in some embodiments. The HF/BHF treatment partially etches the isolation insulating layers 20A and 20C, as shown in FIG. 11. Then, the photo resist layer 35 is removed, as shown in FIG. 12A. The photo resist layer 35 is removed by a plasma ashing process followed by a wet cleaning in some embodiments. In some embodiments, the isolation insulating layer 20C has two steps as shown in FIGS. 12A and 12B. FIG. 12B is an enlarged view of the isolation insulating layer 20C.

Figure 12C:
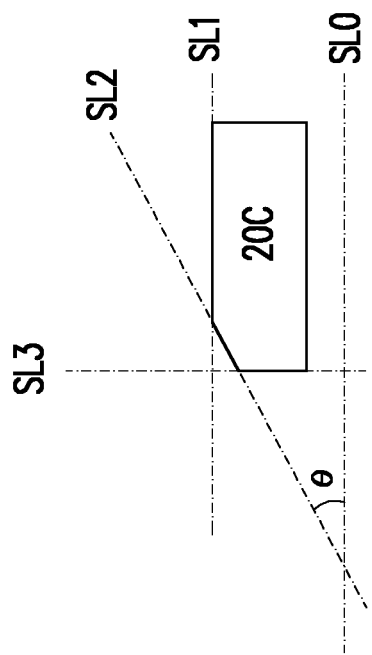

As shown in FIG. 12B, the upper surface of the isolation insulating layer 20C includes, from the logic circuit side to the NVM cell side, a top portion, a step, a middle portion, a slope (an inclined surface having an inclined angle) and a bottom portion. FIG. 12C shows an inclined angle of the flat portions (top, middle and bottom), the step and the slope. The inclined angle of the flat portion is an angle between line (or plane) SL1 and the standard line (or plane) SL0. The standard line SL0 is a horizontal line parallel to the device forming surface of the substrate. The inclined angle of the slope is an angle between line (or plane) SL2 and the standard line (or plane) SL0. The inclined angle of the step is an angle between line (or plane) SL3 and the standard line (or plane) SL0.

The top, middle and/or the bottom portions are substantially flat (e.g., an inclined angle±5 degrees). The inclined angle of the slope is in a range from about 15 degrees to about 75 degrees. Two steps (one step and one slope) are formed between the top portion and the bottom portion in some embodiments. The inclined angle of the step is in a range from about 75 degrees to about 95 degrees. The step height H1 of the step between the top portion and the middle portion corresponds to the etching amount by the HF/BHF treatment and is in a range from about 1 nm to about 50 nm in some embodiments. The step height H2 between the middle portion and the bottom is in a range from about 5 nm to about 120 nm in some embodiments. The width W1 of the middle portion corresponds to the shrinkage amount D3 and is in a range from about 1 nm to about 100 nm in some embodiments. The width W2 of the slope is in a range from about 1 nm to about 50 nm in some embodiments.

In some embodiments, the edge of the resist pattern 35 is located at the NVM cell side (bottom portion) of the isolation insulating layer 20C. FIG. 13A shows the structure after the etch-back operation. By the etch-back operation, a step is formed as shown in FIG. 13A. Then, the cleaning operation including a plasma cleaning PL is performed, and during the plasma cleaning operation, the photo resist layer 35 shrinks as shown in FIG. 13B. The shrinkage amount D3 is in a range from about 1 nm to about 100 nm in some embodiments.

Figure 13C:
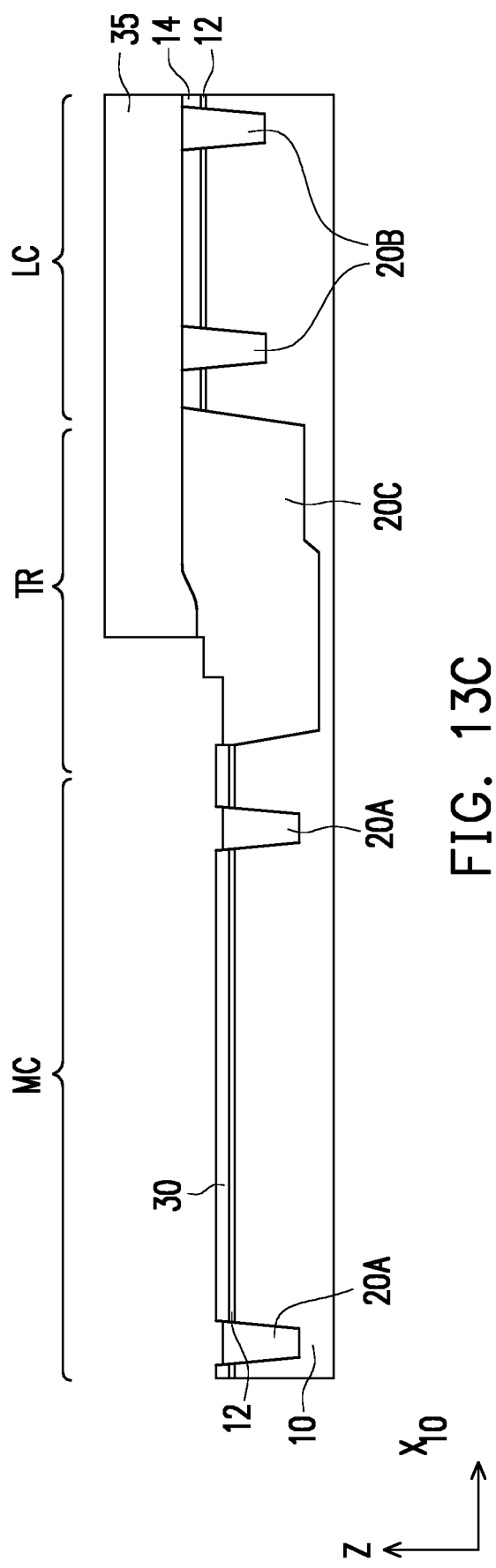
Figure 13D:
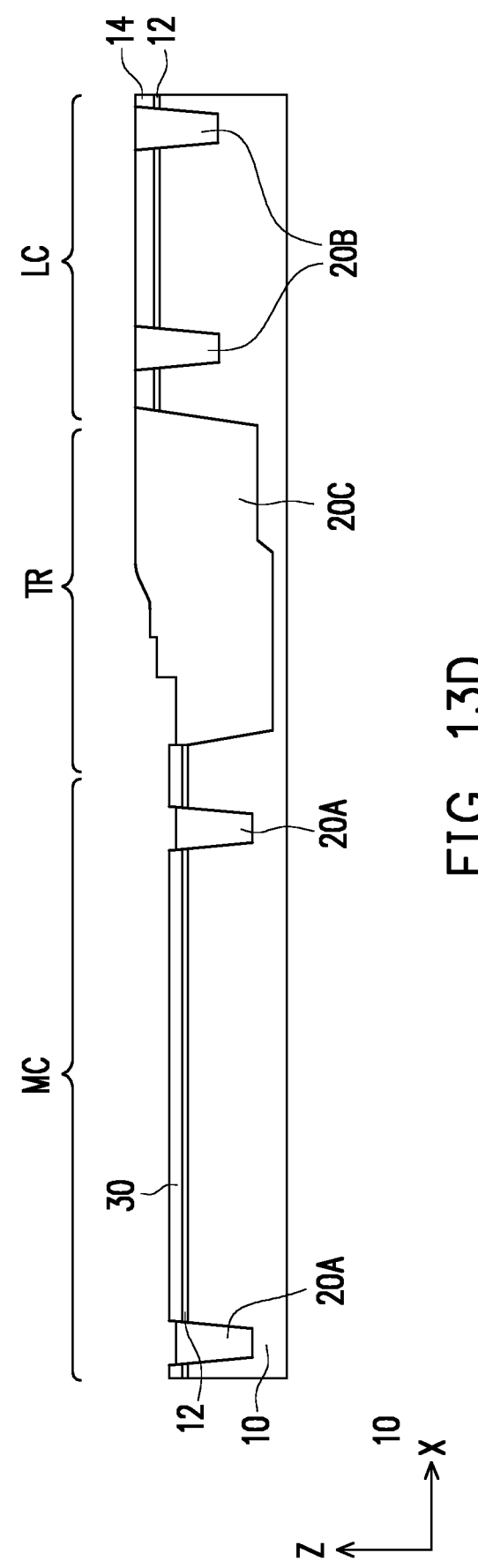

After the plasma cleaning operation, an additional wet cleaning operation is performed, by using, for example, a HF or buffered HF (BHF) solution, as shown in FIG. 13C. The HF/BHF treatment partially etches the isolation insulating layers 20A and 20C, as shown in FIG. 13C. Then, the photo resist layer 35 is removed, as shown in FIG. 13D.

Figure 13E:
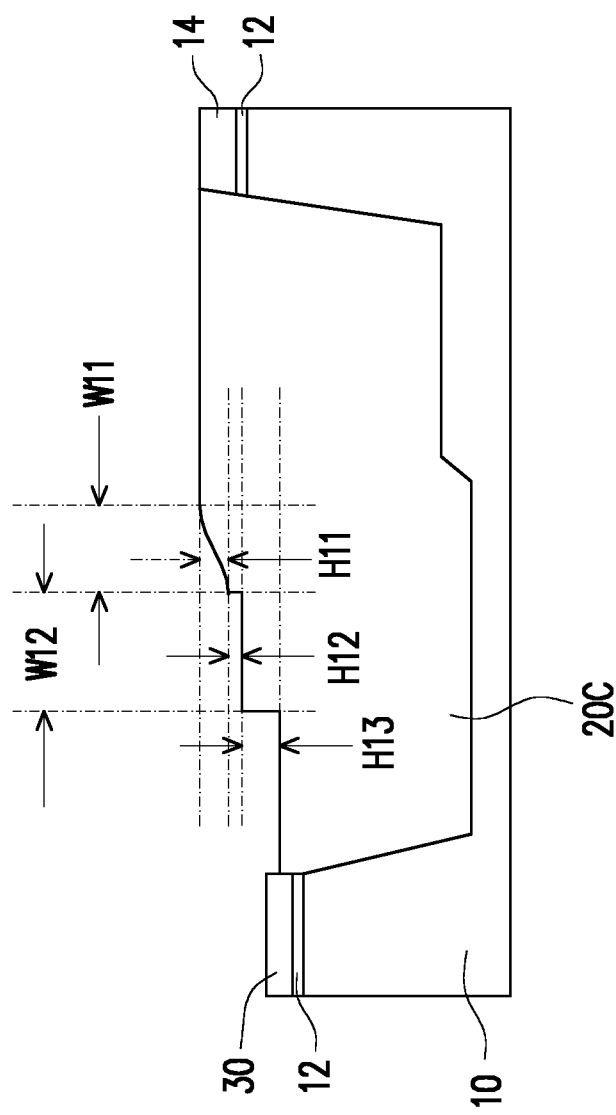

FIG. 13E is an enlarged view of the isolation insulating layer 20C in the transition area TR. As shown in FIG. 13E, the upper surface of the isolation insulating layer 20C includes, from the logic circuit side to the NVM cell side, a top portion, a slope, a first step, a middle portion, a second step and a bottom portion. Three steps (two steps and one slope) are formed between the top portion and the bottom portion. The step height H11 of the slope between the top portion and the middle portion is in a range from about 5 nm to about 50 nm in some embodiments. The step height H12 of the first step between the slope and the middle portion corresponds to the etching amount by the HF/BHF treatment and is in a range from about 1 nm to about 50 nm in some embodiments. The step height H13 of the second step between the middle portion and the bottom portion is in a range from about 10 nm to about 100 nm in some embodiments. The width W12 of the middle portion corresponds to the shrinkage amount D3 and is in a range from about 1 nm to about 100 nm in some embodiments. The width W11 of the slope is in a range from about 1 nm to about 50 nm in some embodiments.

In some embodiments, the edge of the resist pattern 35 is located at the logic cell side (bottom portion) of the isolation insulating layer 20C. FIG. 14A shows the structure after the etch-back operation. By the etch-back operation, a step is formed as shown in FIG. 14A. Then, the cleaning operation, including a plasma cleaning PL, is performed, and during the plasma cleaning operation, the photo resist layer 35 shrinks as shown in FIG. 14B. The shrinkage amount D3 is in a range from about 1 nm to about 100 nm in some embodiments.

Figure 14C:
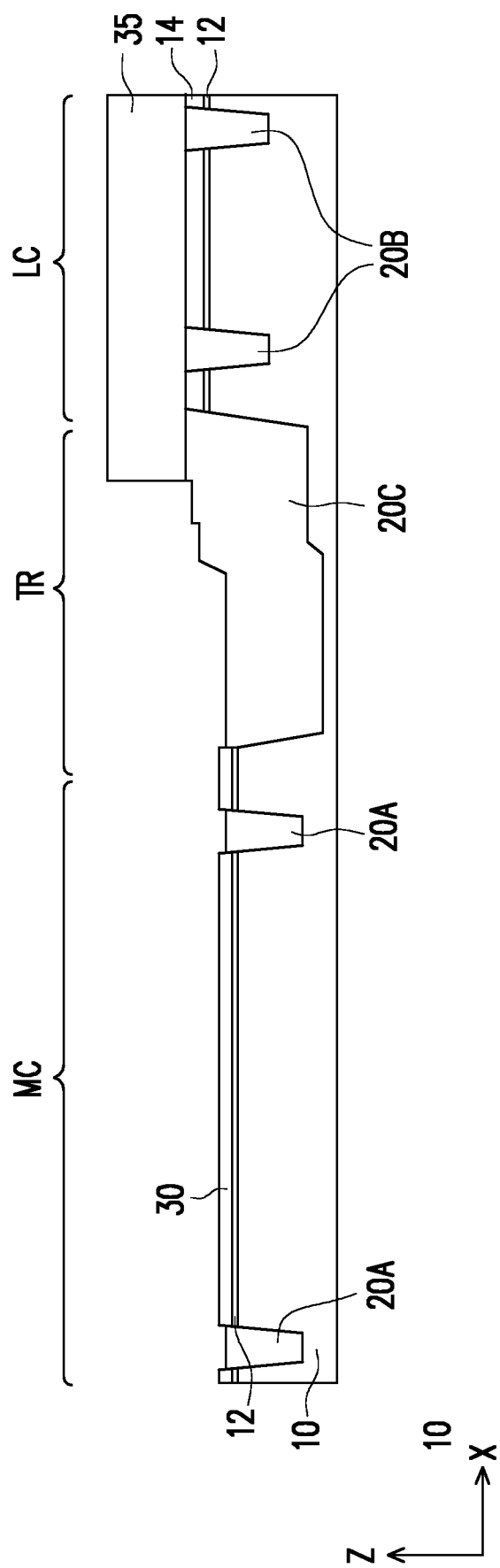
Figure 14D:
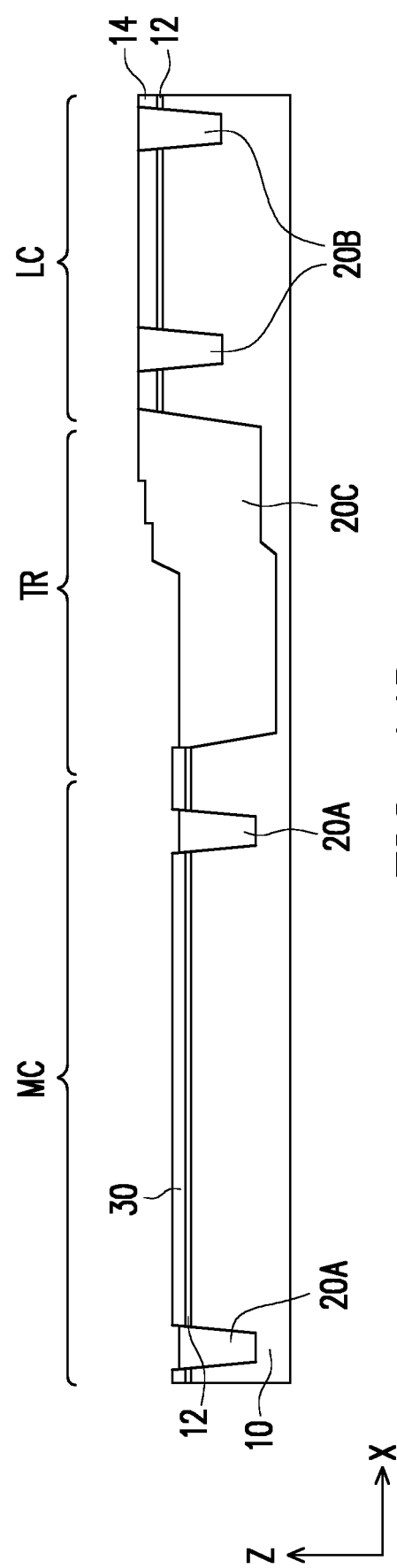

After the plasma cleaning operation, an additional wet cleaning operation is performed, by using, for example, a HF or buffered HF (BHF) solution, as shown in FIG. 14C. The HF/BHF treatment partially etches the isolation insulating layers 20A and 20C, as shown in FIG. 14C. Then, the photo resist layer 35 is removed, as shown in FIG. 14D.

Figure 14E:
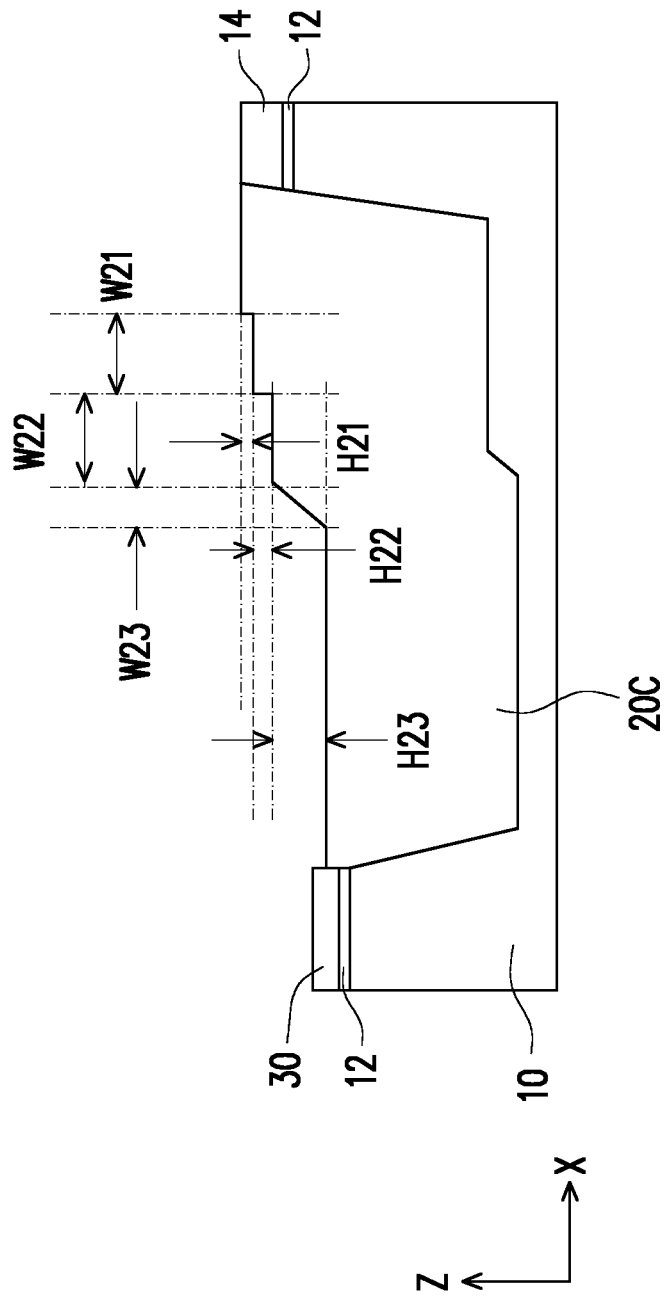

FIG. 14E is an enlarged view of the isolation insulating layer 20C in the transition area TR. As shown in FIG. 14E, the upper surface of the isolation insulating layer 20C includes, from the logic circuit side to the NVM cell side, a top portion, a first step, a first middle portion, a second step, a second middle portion, a slope and a bottom portion. Three steps (two steps and one slope) are formed between the top portion and the bottom portion. The step height H21 of the first step between the top portion and the first middle portion corresponds to the etching amount by the HF/BHF treatment and is in a range from about 1 nm to about 50 nm in some embodiments. The step height H22 of the second step between the first middle portion and the second middle portion is in a range from about 1 nm to about 50 nm in some embodiments. The step height H23 of the slope between the second middle portion and the bottom portion is in a range from about 10 nm to about 100 nm in some embodiments. The width W21 of the first middle portion corresponds to the shrinkage amount D3 and is in a range from about 1 nm to about 100 nm in some embodiments. The width W22 of the second middle portion is in a range from about 1 nm to about 100 nm in some embodiments. The width W23 of the slope is in a range from about 1 nm to about 50 nm in some embodiments.

Figure 15A:
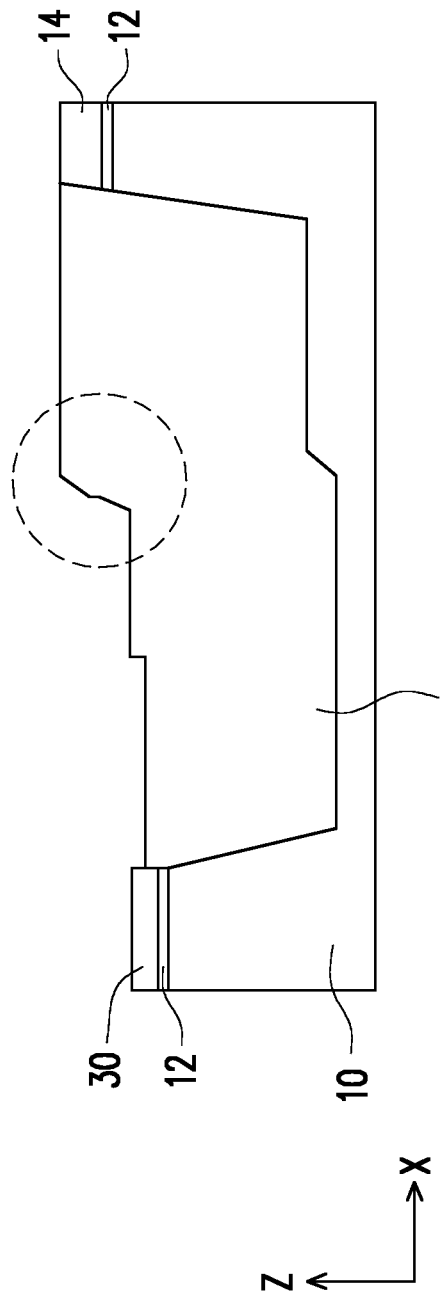
FIGS. 15A and 15B show cross sectional views illustrating one of various stages of a sequential process for manufacturing a semiconductor device including the NVM area and the circuit areas according to another embodiment of the present disclosure.
Figure 15B:
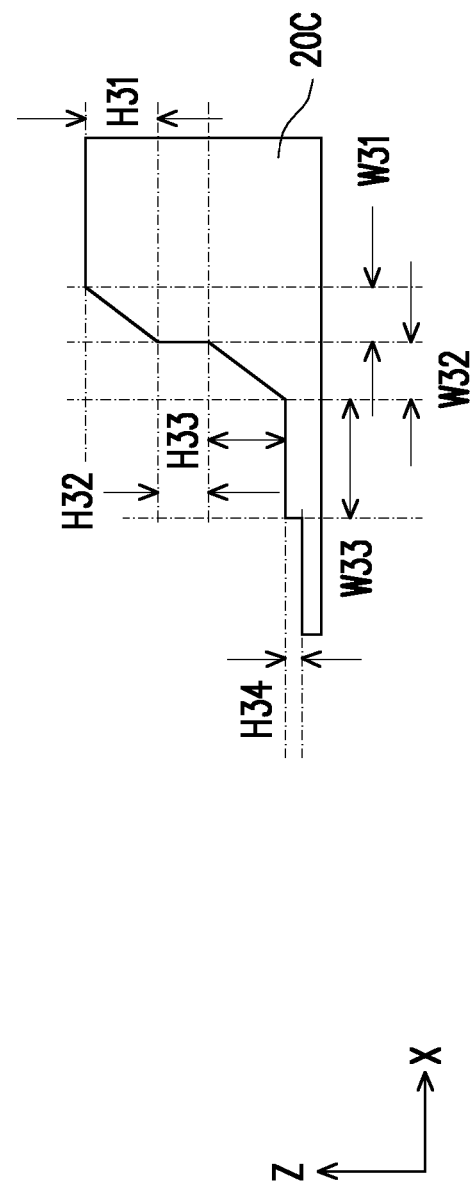

In some embodiments, after the cleaning operation including the plasma cleaning operation, the edge of the photo resist layer 35 is located at the initial slope of the isolation insulating layer 20C. In such a case, as shown in FIGS. 15A and 15B, the upper surface of the isolation insulating layer 20C includes, from the logic circuit side to the NVM cell side, a top portion, a first slope, a first step, a second slope, a middle portion, a second step and a bottom portion. Four steps (two steps and two slopes) are formed between the top portion and the bottom portion.

The height H31 of the first slope is in a range from about 1 nm to about 50 nm in some embodiments. The height H32 of the first step corresponds to the etching amount by the HF/BHF treatment and is in a range from about 1 nm to about 50 nm in some embodiments. The height H33 of the second slope is in a range from about 1 nm to about 50 nm in some embodiments. The step height H34 between the middle portion and the bottom portion is in a range from about 1 nm to about 50 nm in some embodiments. The width W31 of the first slope is in a range from about 1 nm to about 50 nm in some embodiments. The width W32 of the second slope portion is in a range from about 1 nm to about 50 nm in some embodiments. The width W33 of the middle portion is in a range from about 1 nm to about 50 nm in some embodiments. The sum of the width W32 and width W33 corresponds to the shrinkage amount D3.

After the planarization operation and thickness reduction operation, the thickness of the first polysilicon layer 30 is in a range from about 10 nm to about 100 nm in some embodiments. The first polysilicon layer 30 is appropriately doped with impurities and is utilized for floating gates of NVM cells. The polysilicon layer 30 may be replaced with an amorphous silicon layer.

Figure 16:
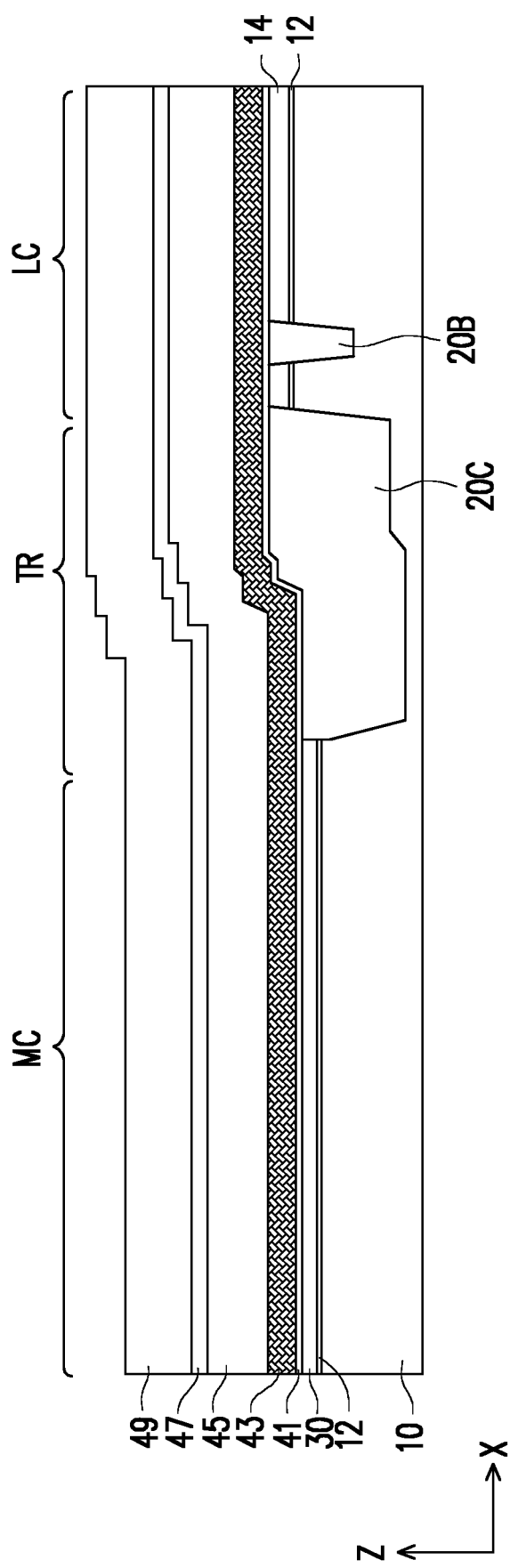

Next, as shown in FIG. 16, a stacked layer is formed for forming a control gate. In some embodiments, a second dielectric layer 41 is formed over the first polysilicon layer 30 in the NVM cell area MC and over the transition area TR and the logic circuit area LC. In some embodiments, the second dielectric layer 41 includes a silicon oxide layer, a silicon nitride layer or multilayers of silicon oxide and silicon nitride. In some embodiments, the second dielectric layer 41 is an ONO film. The thickness of the second dielectric layer 41 is in a range from about 1 nm to about 50 nm in some embodiments. The second dielectric layer 41 can be formed by CVD or ALD in some embodiments.

After the second dielectric layer 41 is formed, a second polysilicon layer 43 is formed over the second dielectric layer 41. The second polysilicon layer 43 can be formed by CVD or ALD, and the thickness of the second polysilicon layer 43 is in a range from about 5 nm to about 50 nm, in some embodiments.

Further, as shown in FIG. 16, a hard mask layer including a first silicon nitride layer 45, a silicon oxide layer 47 and a second silicon nitride layer 49 is formed over the second polysilicon layer 43. In some embodiments, the hard mask layer is formed by CVD or ALD, and the total thickness thereof is in a range from about 20 nm to about 200 nm.

It is noted that the step(s) and the slope(s) shown in FIGS. 12A and 12B, 13D and 13E, 14D and 14E, or 15A and 15B are covered by the second dielectric layer 41 and the second polysilicon layer 43, which are not removed from the step and/or slope portions in the subsequent manufacturing operations. Accordingly, the shape of the upper surface of the isolation insulating layer 20C shown in FIGS. 12A and 12B, 13D and 13E, 14D and 14E, or 15A and 15B (in particular, the memory cell side structure including the highest portion) remains in a semiconductor device as a final product.

Figure 17:
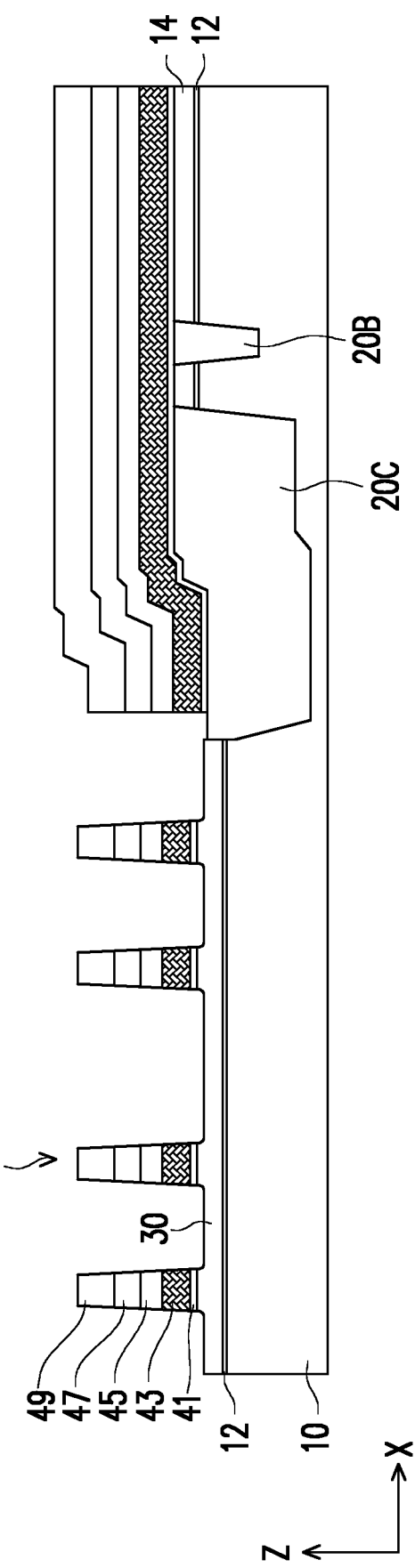

By using a patterning operation including lithography and etching, the hard mask layer is patterned, and by using the patterned hard mask layer as an etching mask, the second polysilicon layer 43 and the second dielectric layer 41 are patterned into a control gate structure 40 as shown in FIG. 17. In some embodiments, no pattern is formed in the logic circuit area LC.

Figure 18:
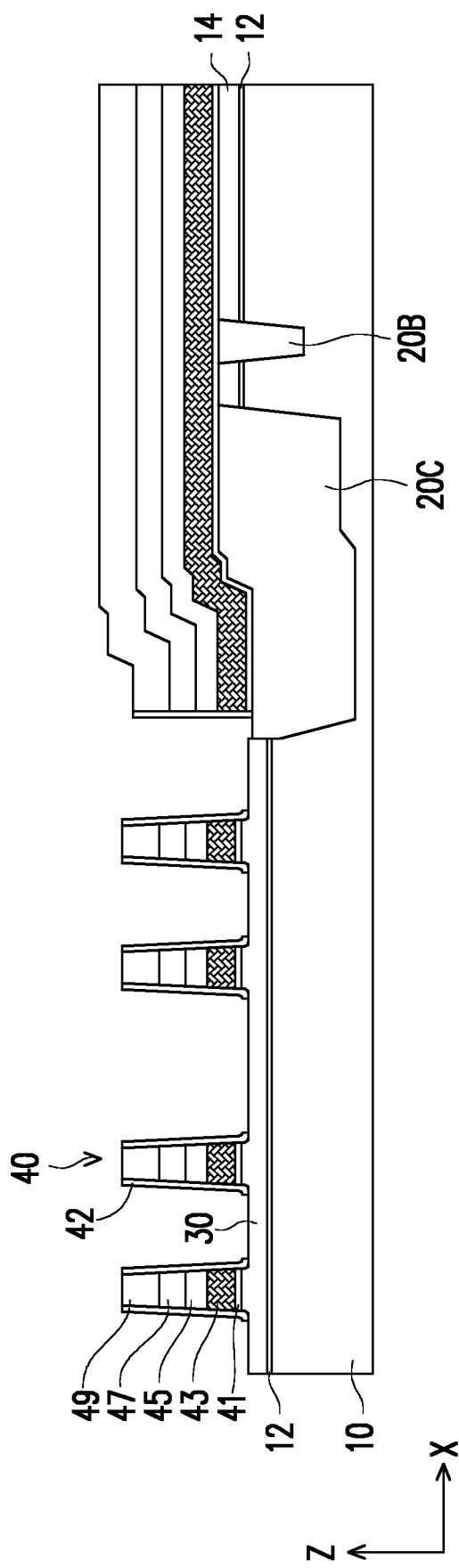

After the patterning operation of the second polysilicon layer 43 and the second dielectric layer 41, first sidewall spacers 42 are formed on both sides of the patterned second polysilicon layers in the NVM cell area MC, as shown in FIG. 18. The first sidewall spacers 42 are made of silicon oxide in some embodiments. A blanket layer of silicon oxide is formed, for example by CVD, over the entire substrate and then anisotropic etching is performed, thereby forming the first sidewall spacers 42. The thickness of the first sidewall spacers 42 is in a range from about 1 nm to about 20 nm in some embodiments. In some embodiments, the first sidewall spacers 42 have a multilayer structure. In some embodiments, the first sidewall spacers 42 include an ONO film having a silicon nitride layer sandwiched by two silicon oxide layers. The thicknesses of the silicon oxide layer, the silicon nitride layer and the silicon oxide layer are in ranges of about 1-20 nm, about 1-30 nm and about 1-20 nm, respectively, in some embodiments. In certain embodiments, the first sidewall spacers 42 are a single layer of silicon nitride or silicon oxynitride.

Figure 19:
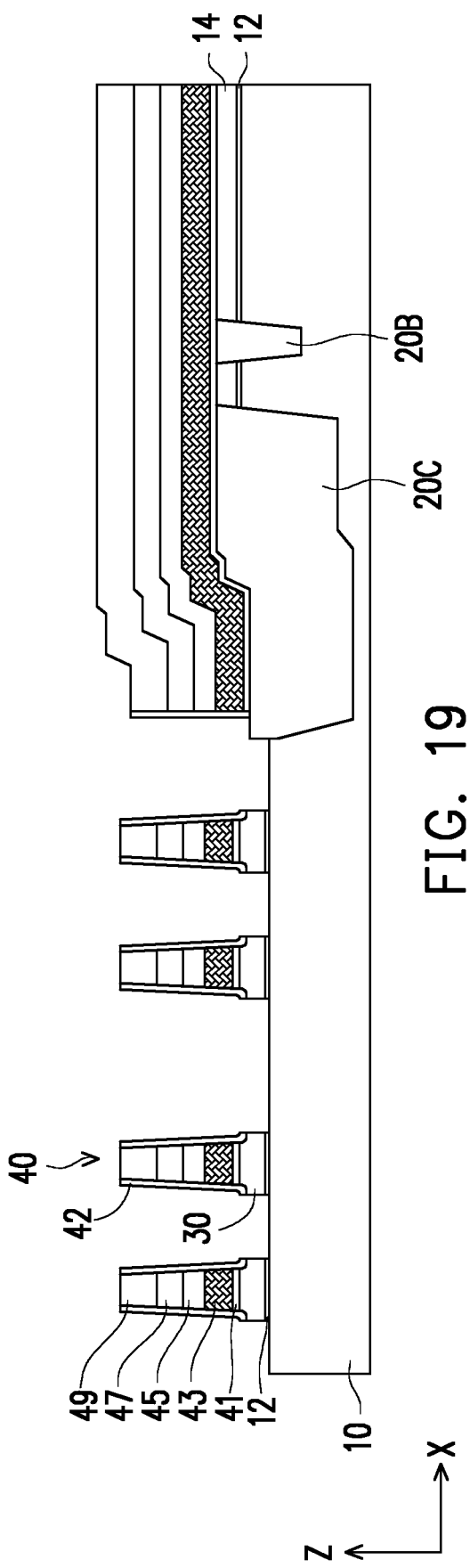

After the first sidewall spacers 42 are formed, the first polysilicon layer 30 is patterned by using one or more etching operations, as shown in FIG. 19. In some embodiments, the etching is performed in a self-aligned manner without a photo resist layer, and the first dielectric layer 12 functions as an etch-stop layer.

Figure 20:
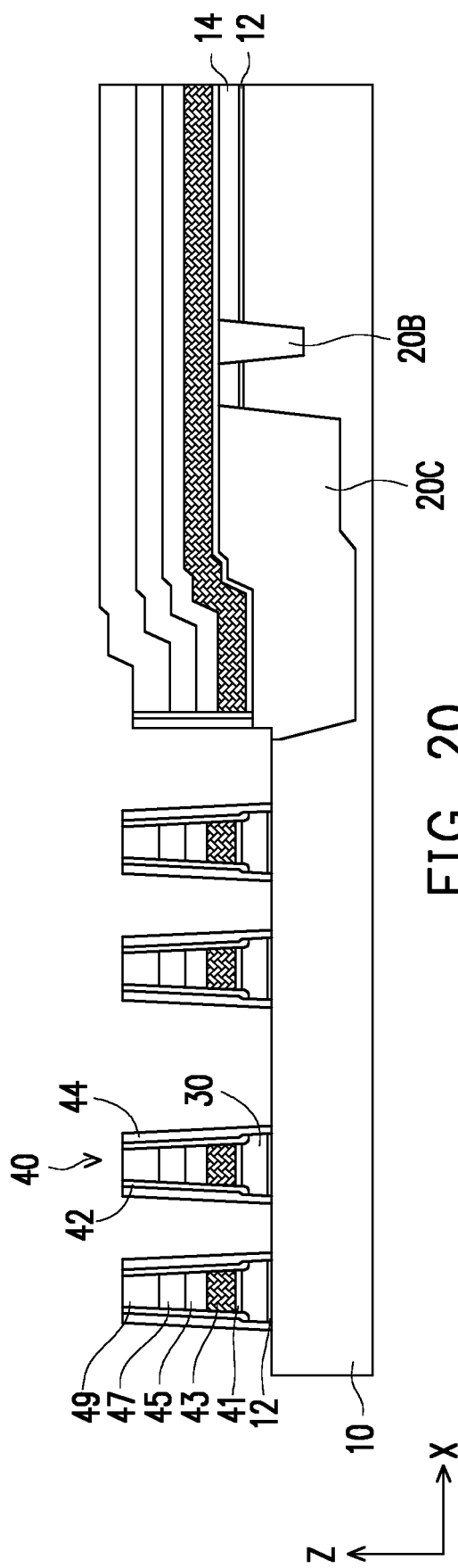

After the first polysilicon layer 30 is patterned, second sidewall spacers 44 are formed, as shown in FIG. 20. The second sidewall spacers 44 are made of silicon oxide in some embodiments. A blanket layer of silicon oxide is formed, for example by CVD, over the entire substrate and then anisotropic etching is performed, thereby forming the first sidewall spacers 44. By this etching, the first dielectric layer 12 not covered by the control gate structure 40 is removed in some embodiments.

Figure 21:
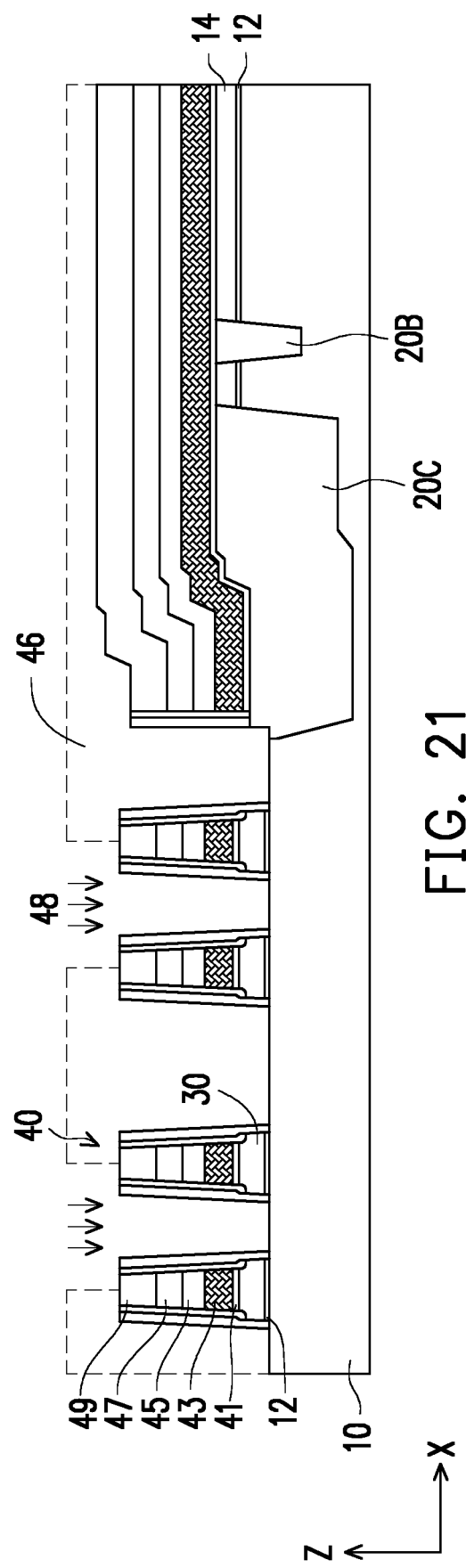
Figure 22:
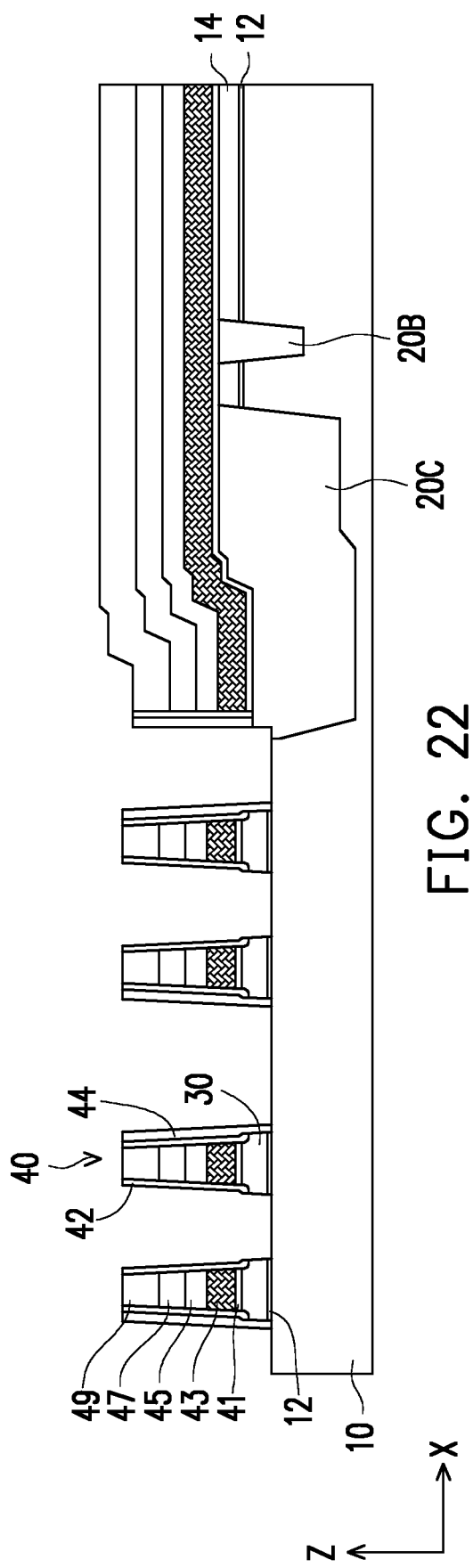

Further, a photo resist pattern 46 having openings over common source lines (erase gates) is formed, and one or more ion implantation operations 48 are performed to introduce impurities for the common source lines (under the erase gates), as shown in FIG. 21. Further, the second sidewall spacers 44 in the openings over the common source lines are removed. In some embodiments, a HF or buffered HF (BHF) solution is used as a wet etchant. Then, the photo resist pattern 46 is removed, as shown in FIG. 22.

Figure 23:
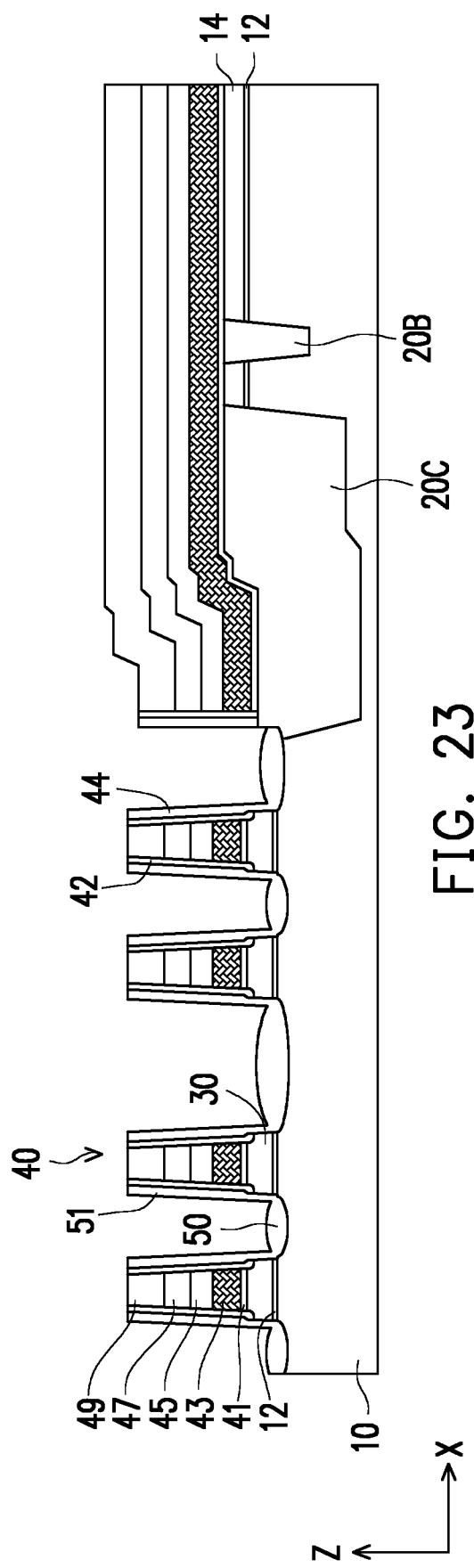
Figure 24:
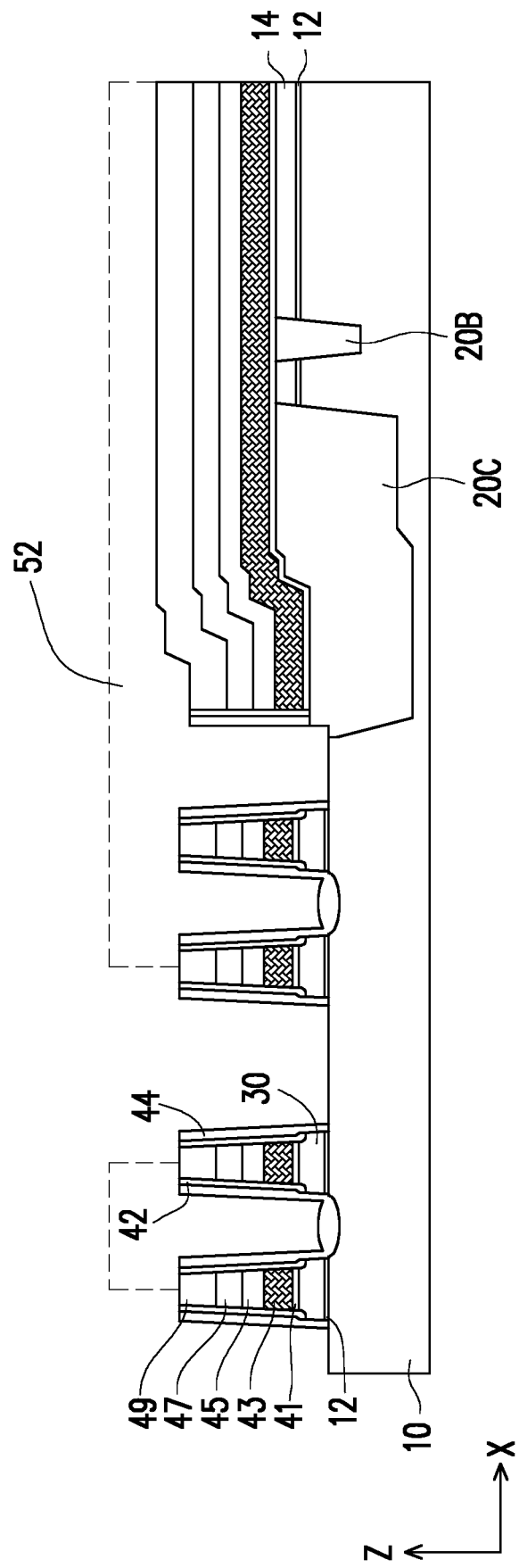

Then, an erase-gate oxide 50 is formed as shown in FIG. 23. In some embodiments, the erase-gate oxide 50 is made of silicon oxide formed by a thermal oxidation process. In some embodiments, a thin layer of silicon oxide 51 is formed on the side of the control gate structure 40. Next, as shown in FIG. 24, a photo resist pattern 52 having openings over word lines (select gates) is formed, and an oxide layer over the word line regions is removed.

Figure 25:
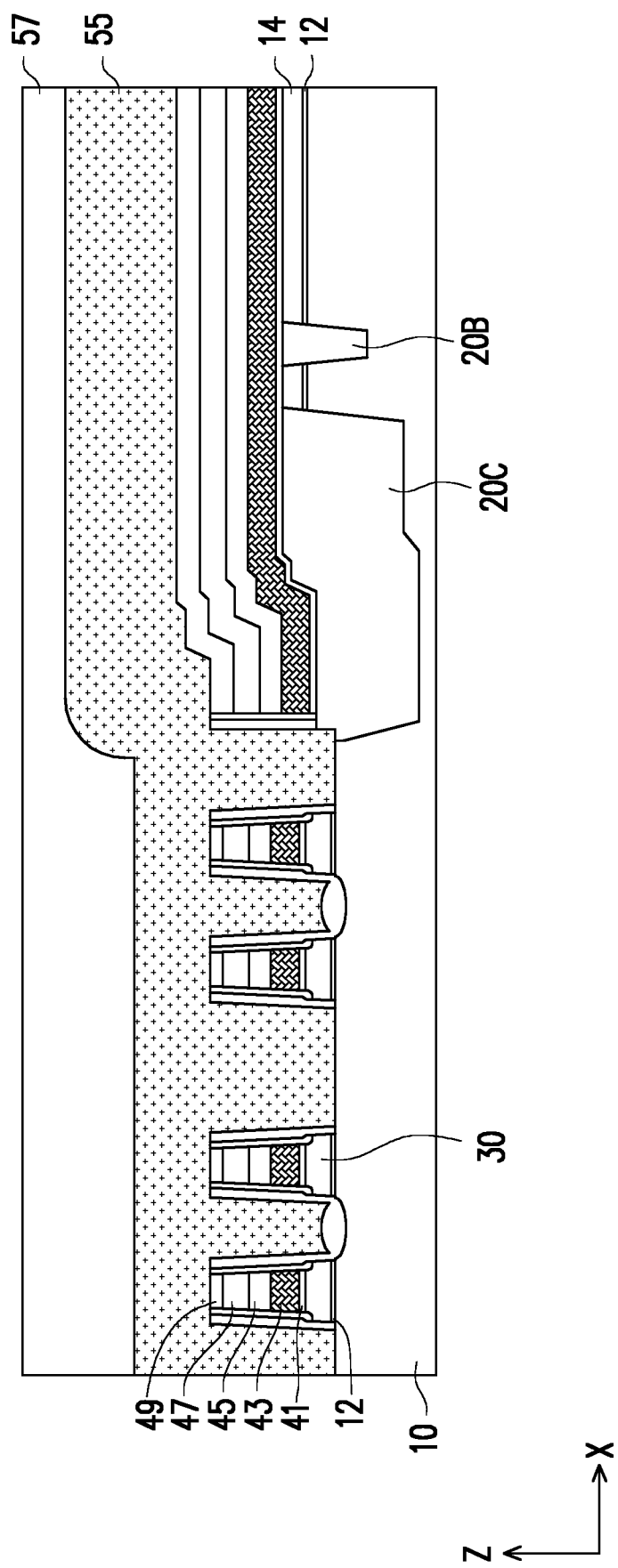

Further, a third dielectric layer (not shown) and a third polysilicon layer 55 for a select gate are formed as shown in FIG. 25. In some embodiments, the first dielectric layer 12 remains at the word line region as the third dielectric layer (gate dielectric layer). A coating layer 57 is further formed on the third polysilicon layer 55. In some embodiments, the coating layer 57 is a photo resist layer. The thickness of the third polysilicon layer 55 is in a range from about 40 nm to about 200 nm in some embodiments.

Figure 26:
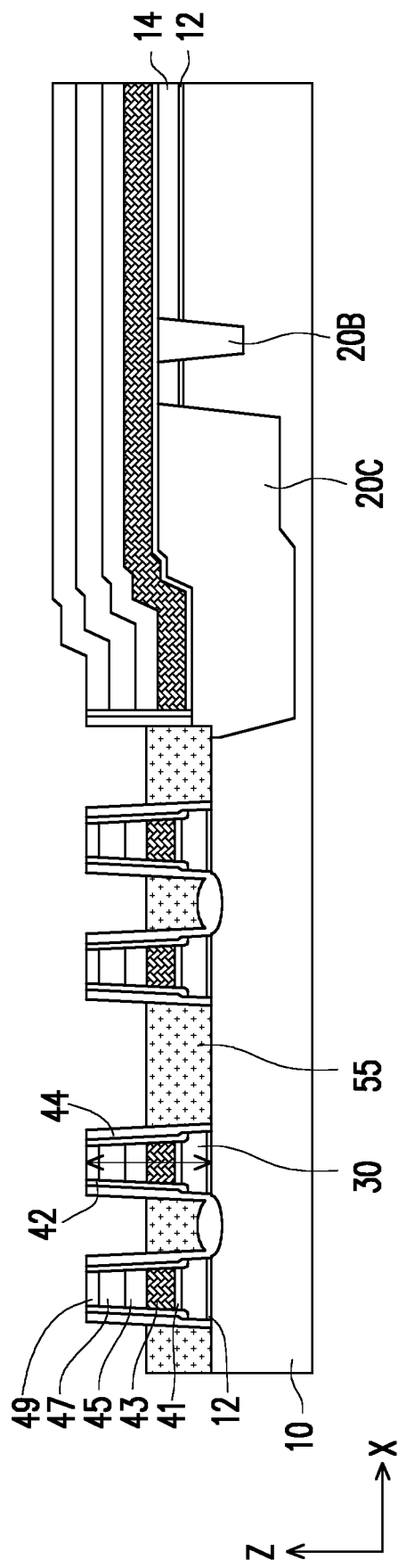

By using a planarization operation and/or an etch-back operation, the thickness of the third polysilicon layer 55 is reduced and separated into select gates (not separated yet) and erase gates, as shown in FIG. 26. In some embodiments, the height of the top of the select gates and the erase gates 55 is substantially the same as the height of the top of the control gate 43 (e.g., within ±5 nm).

Figure 27:
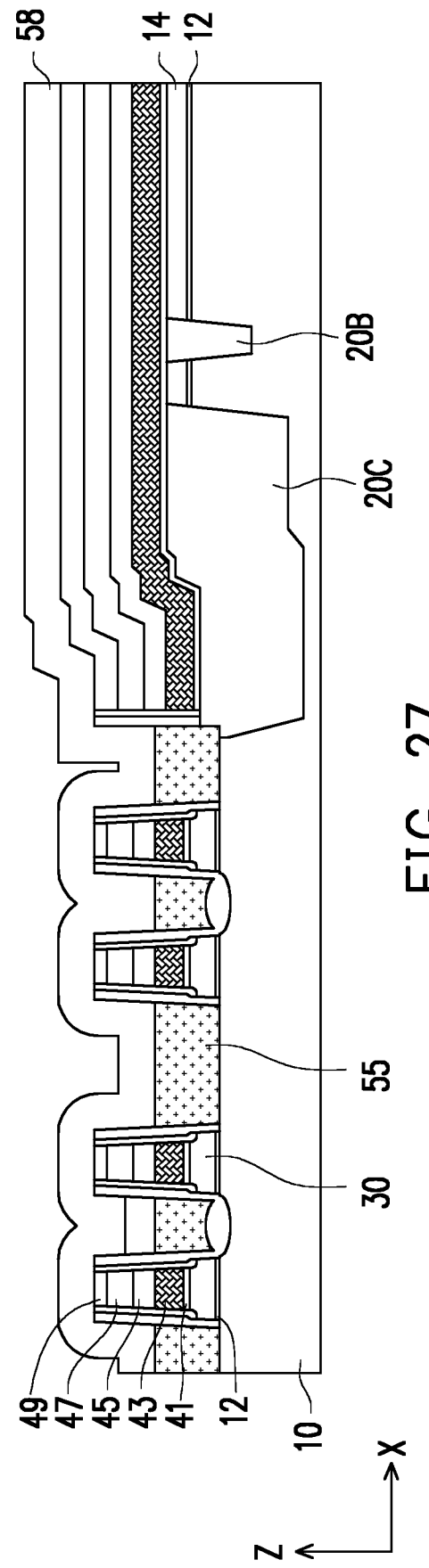
Figure 28:
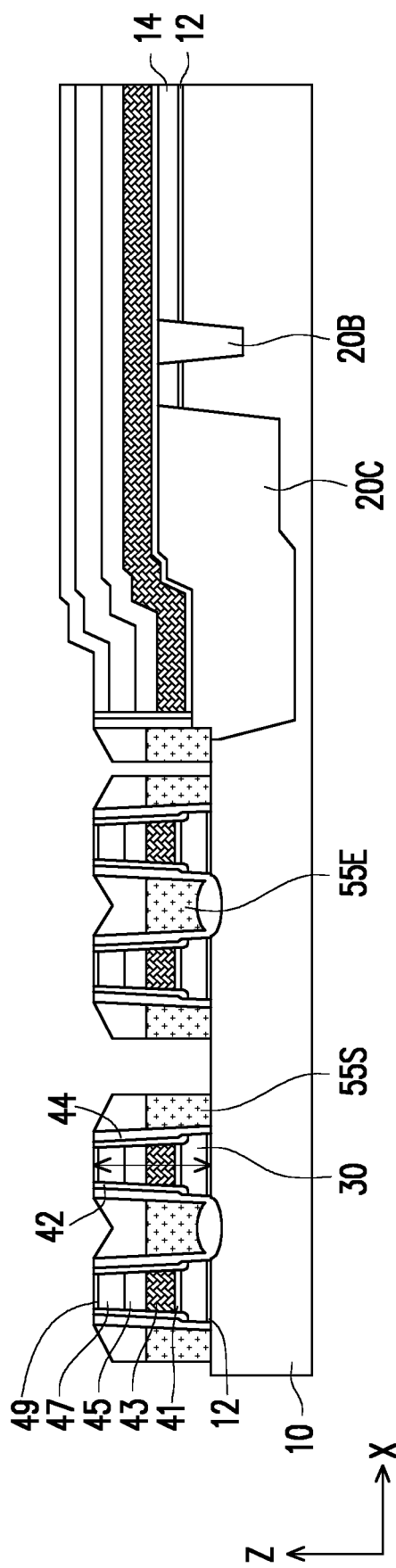

Then, a hard mask layer 58 is formed as shown in FIG. 27. By using one or more lithography and etching operations, the hard mask layer 58 is patterned, and by using the patterned hard mask layer as an etching mask, the polysilicon layer 55 is patterned and separated into select gates, as shown in FIG. 28. In other embodiments, the hard mask layer and the polysilicon layer are patterned in a self-aligned manner without using a photo resist layer.

Figure 29:
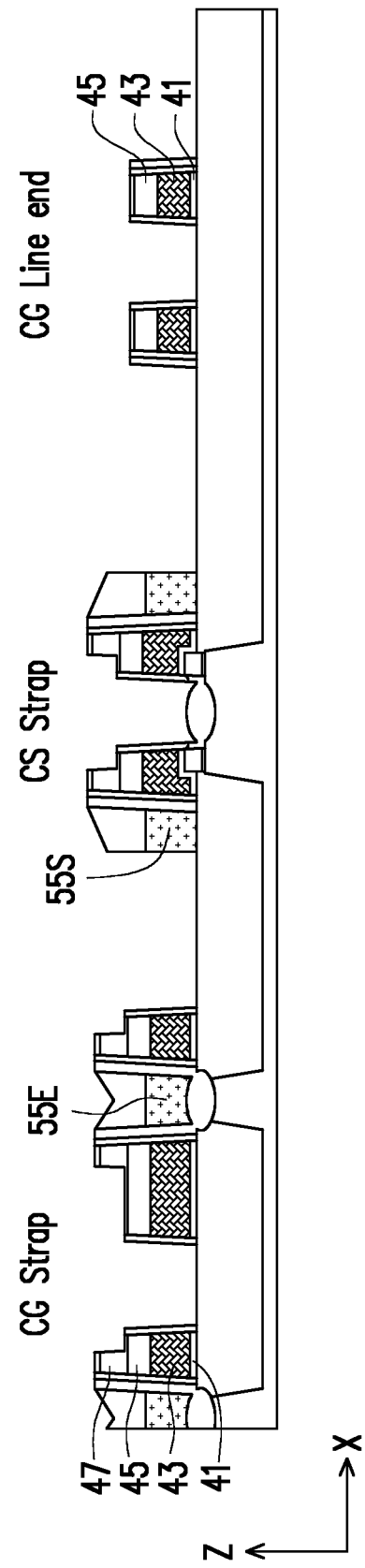

Then, in some embodiments, the third polysilicon layer at the cell end portions along the word line is removed as shown in FIG. 29. FIG. 29 is a cross sectional view at the cell end portion, which is different location from other figures along the Y direction. In some embodiments, the cell end portion includes control gate end portions, a control gate strap area and an erase gate (common source) strap area.

Further, the second silicon nitride layer 49 in the transition area TR and the logic circuit area LC is removed by using one or more lithography and etching operations as shown in FIG. 30. In some embodiments, a part of the second silicon nitride layer 49 remains in the transition area TR.

Figure 32:
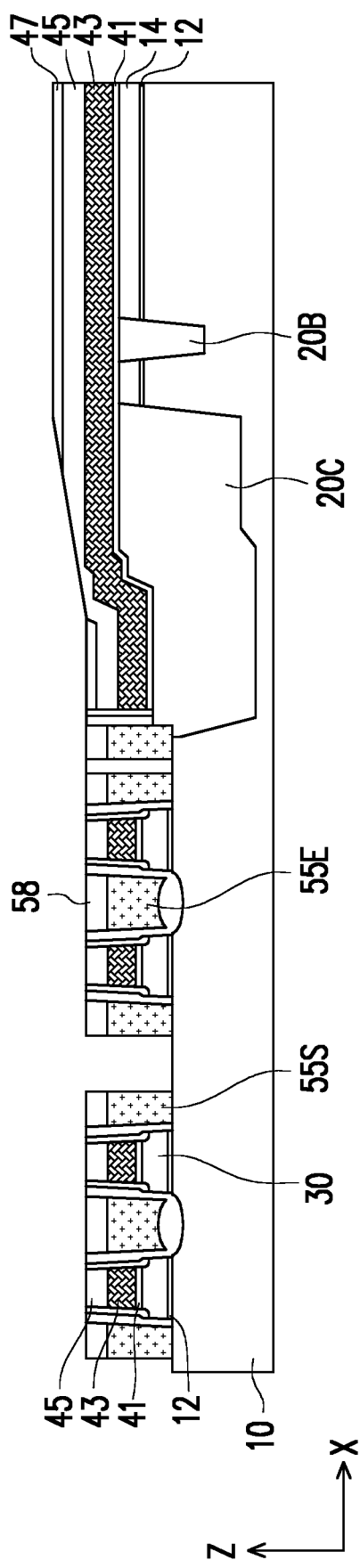

Further, a coating layer 59 for an etch-back operation is formed as shown in FIG. 31, and one or more etch-back operation is performed to make a gradual slope between the logic circuit area LC and the NVM cell area MC, as shown in FIG. 32. In some embodiments, the coating layer 59 includes an organic material, such as photo resist or bottom antireflective coating (BARC) material.

Figure 33:
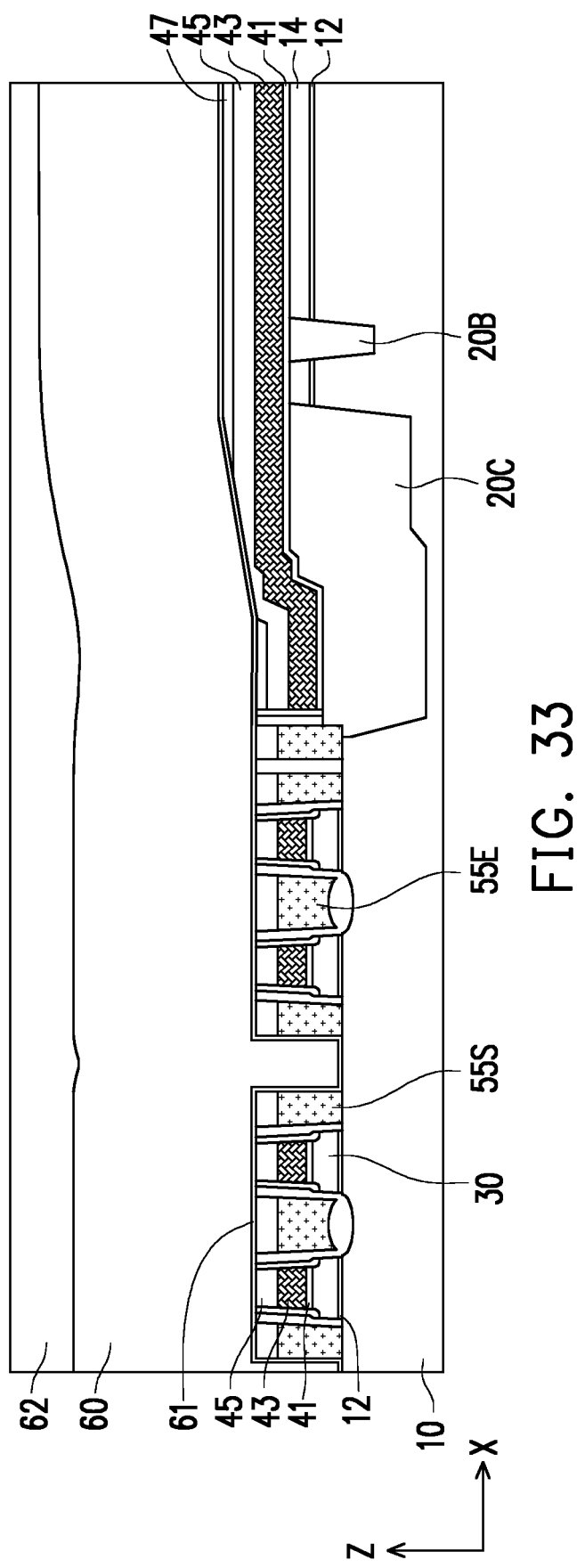
Figure 34:
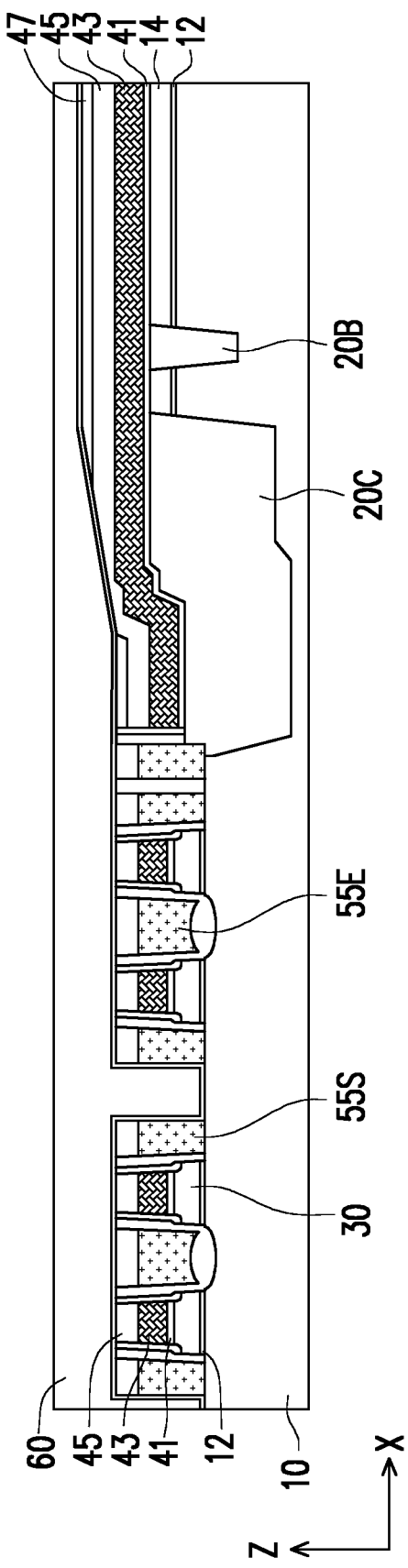

Then, a liner layer 61 is formed and then a fourth polysilicon layer 60 is formed on the liner layer 61, as shown in FIG. 33. Further, a coating layer 62 is formed on the fourth polysilicon layer 60. In some embodiments, the liner layer 61 is made of an insulating material, such as, silicon oxide. In some embodiments, the coating layer 62 includes an organic material, such as a photo resist or a BARC material. In some embodiments, an amorphous silicon layer is used instead of the polysilicon layer 60. Then, one or more planarization operations, such as a CMP operation and an etch-back operation, are performed to flatten the fourth polysilicon layer 60, as shown in FIG. 34.

Figure 35:
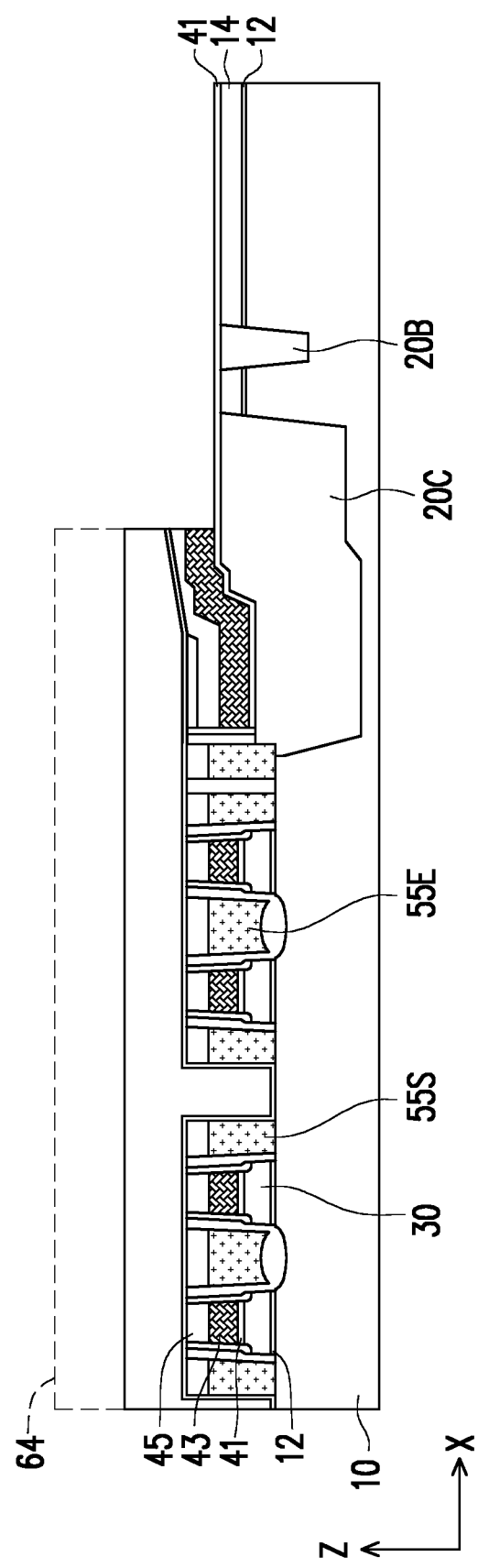
Figure 36:
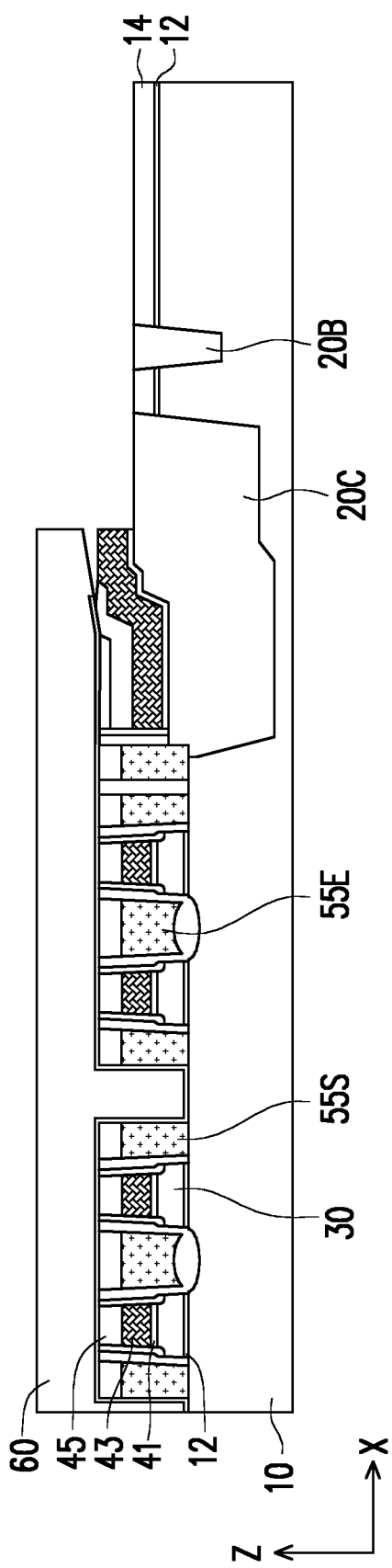

Subsequently, a photo resist pattern 64 is formed, and the stacked layers of layers 60, 61, 47 and 45 are removed in the logic circuit area LC and in a part of the transition area TR, as shown in FIG. 35. Then, the layers 43 and 41 are removed by using one or more wet etching operations, as shown in FIG. 36. In some embodiments, a part of the first silicon nitride layer 45 above the transition area TR under the fourth polysilicon layer 60 is partially removed.

Figure 37:
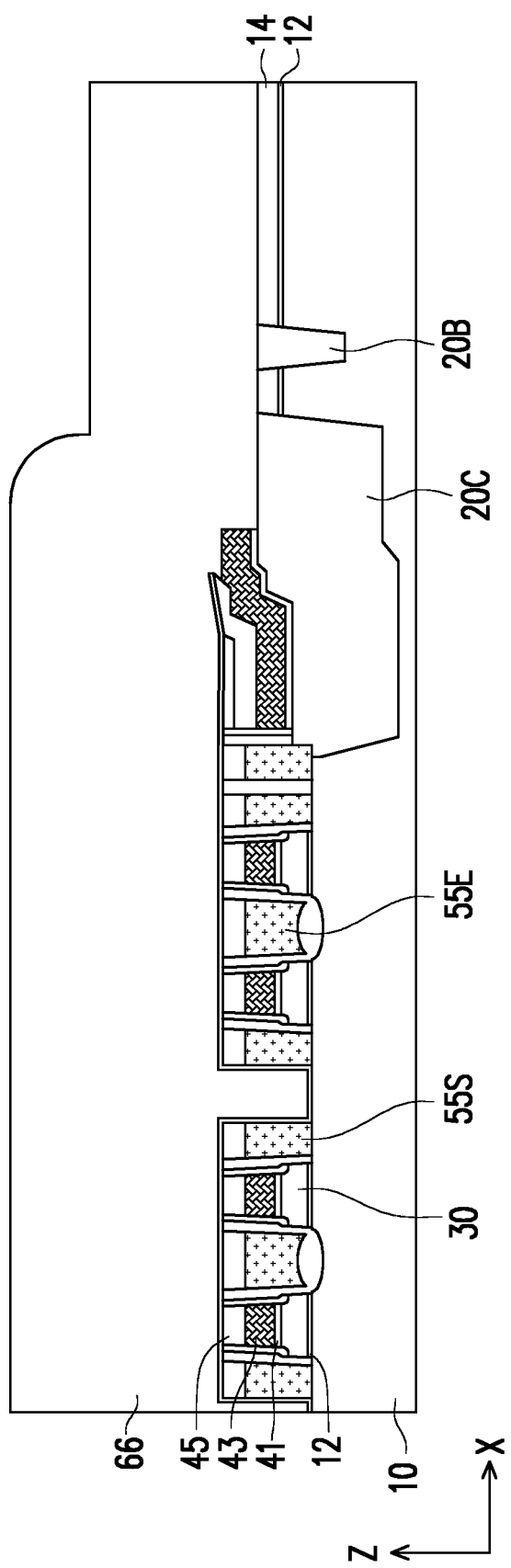

Further, a fifth polysilicon layer 66 is formed as shown in FIG. 37. In some embodiments, an amorphous silicon layer is used instead of the polysilicon layer 66. Then, one of more etching operations are performed to form a protective layer 68 as shown in FIG. 38. The protective layer 68 protects the NVM cell area MC and the patterns in the transition area TR when the logic circuit area LC is processed. Further, the silicon nitride layer 14 in the logic circuit area LC as shown in FIG. 39.

FIGS. 40-56 show cross sectional views illustrating various stages of a sequential manufacturing process for a semiconductor device including a NVM area and a logic circuit areas according to an embodiment of the present disclosure. It is understood that additional operations can be provided before, during, and after processes shown by FIGS. 40-56, and some of the operations described below can be replaced or eliminated, for additional embodiments of the method. The order of the operations may be changed. Materials, processes, configurations and dimensions of the foregoing embodiments are applied to the following embodiments, and the detailed explanation thereof may be omitted.

In FIGS. 40-56, the logic circuit area LC includes a high voltage transistor area HV and a standard voltage transistor area SV. The threshold voltage of FETs in the high voltage transistor area HV is higher in absolute value than the threshold voltage of FETs in standard voltage transistor area SV. In some embodiments, a device forming surface of the substrate in the high voltage transistor area HV is located at the same level or at a lower level than a device forming surface of the substrate in the standard voltage transistor area SV and is located at a higher level than the device forming surface of the substrate in the NVM cell area MC.

Figure 40:
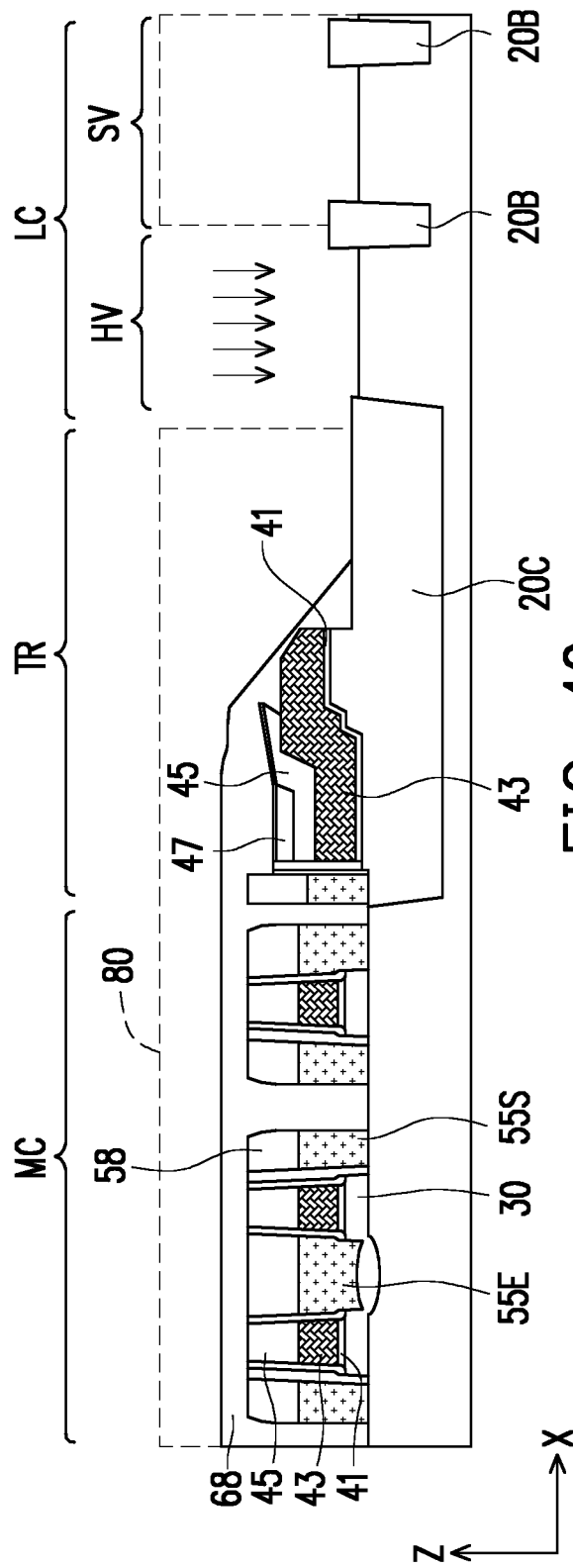
Figure 41:
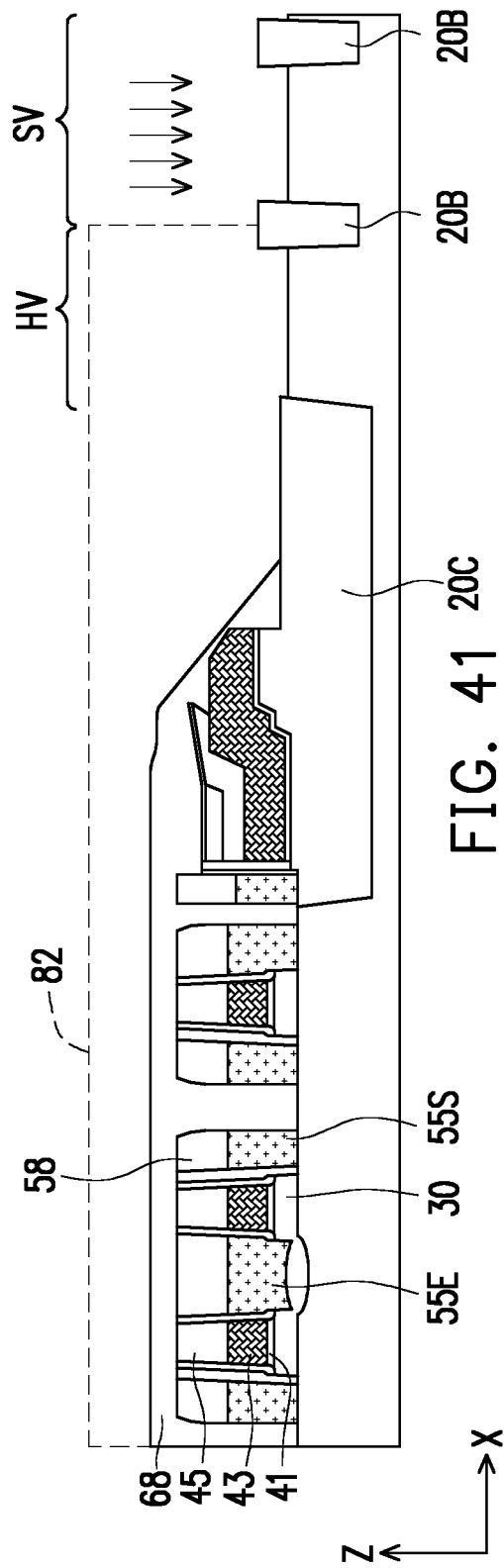

Subsequent to the manufacturing stage shown in FIG. 39, one or more ion implantation processes are performed through the opening formed in a photo resist layer 80 in the high voltage transistor area HV, as shown in FIG. 40. Further, one or more ion implantation processes are performed through the opening formed in a photo resist layer 82 in the standard voltage transistor area SV, as shown in FIG. 41.

Figure 42:
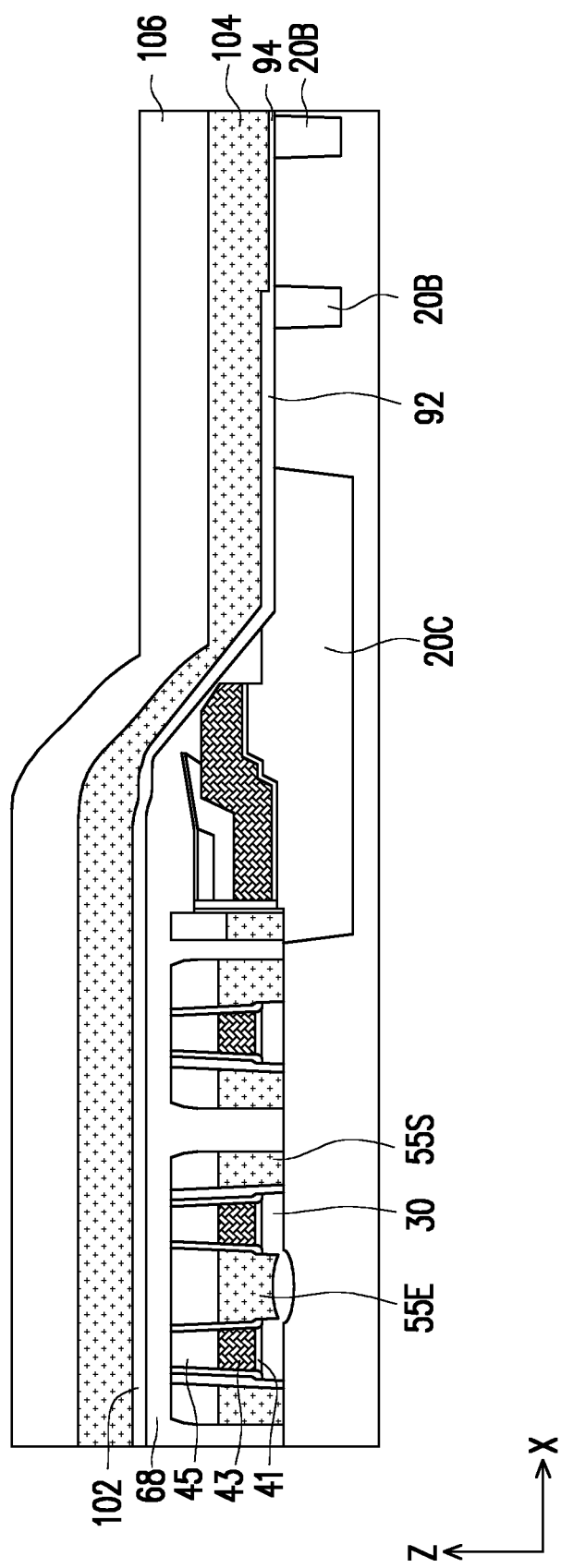

Then, a gate dielectric layer 92 for the high voltage transistor area HV and a gate dielectric layer 94 for the standard voltage transistor area SV are formed in the respective regions as shown in FIG. 42. In some embodiments, the gate dielectric layer 92 and 94 are silicon oxide. In some embodiments, the thickness of the gate dielectric layer 92 is greater than the thickness of the gate dielectric layer 94. In the transition area TR and the NVM cell area MC, an oxide layer 102 is formed, as shown in FIG. 42. Further, a fourth polysilicon layer 104 is formed and a hard mask layer 106 is further formed on the fourth polysilicon layer 104, as shown in FIG. 42.

Figure 43:
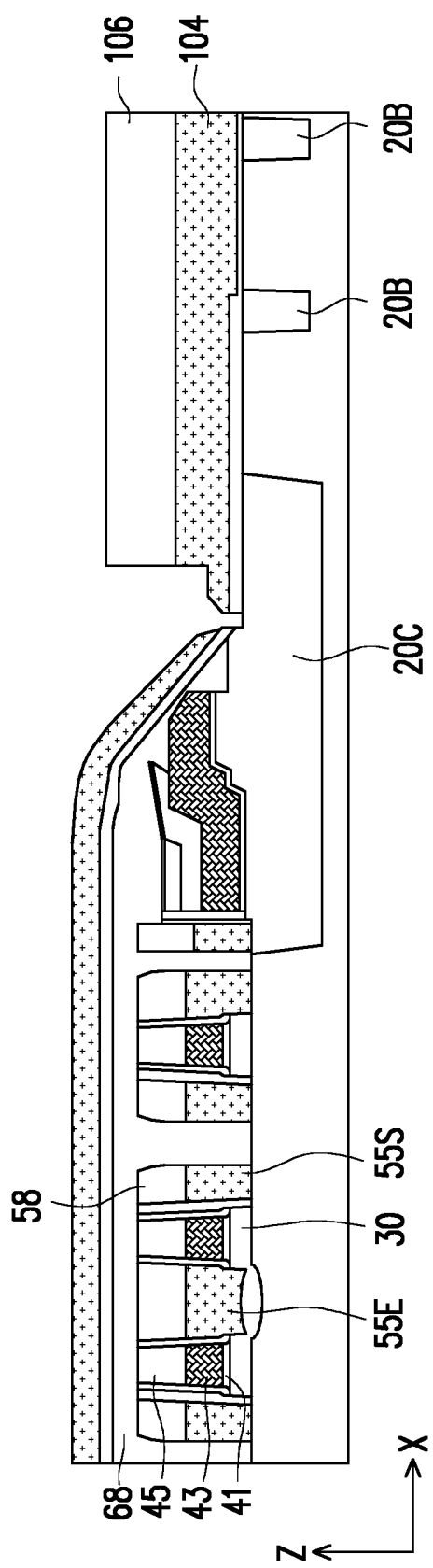

Then, in some embodiments, as shown in FIG. 43, the hard mask layer 106 in the NVM cell area MC and the transition area TR is removed to reduce the height of the NVM cell area MC and the transition area TR for the subsequent lithography process.

Figure 44:
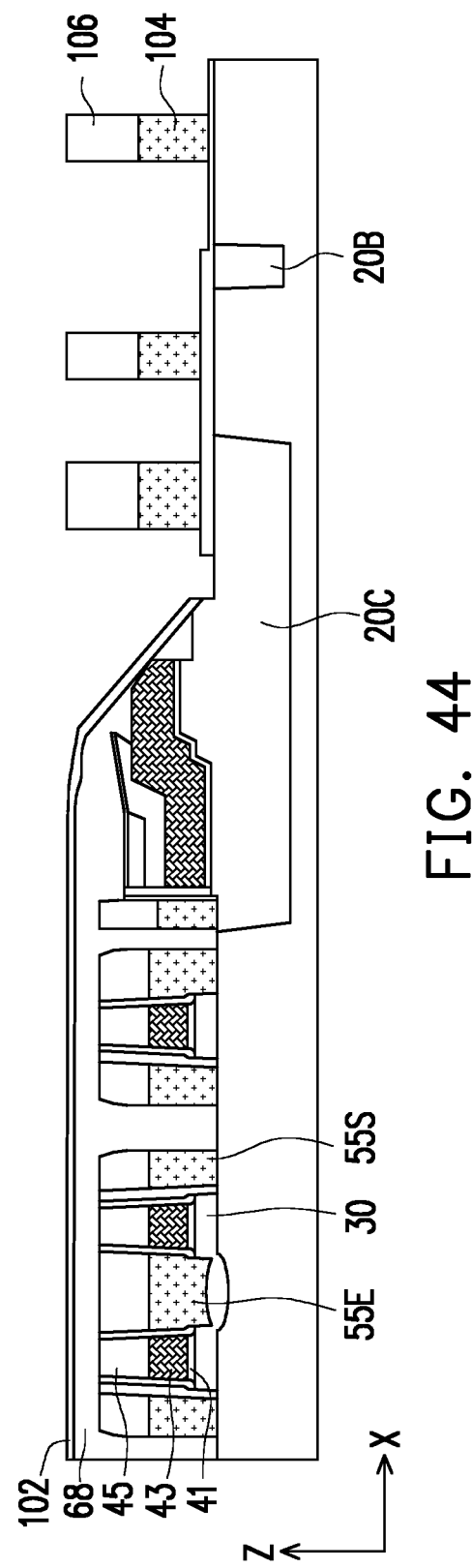

As shown in FIG. 44, by using one or more lithography and etching operations, the hard mask layer 106 and the fourth polysilicon layer 102 are patterned into sacrificial gate structures in the logic circuit area and one or more dummy gate structure in the transition area.

Figure 45:
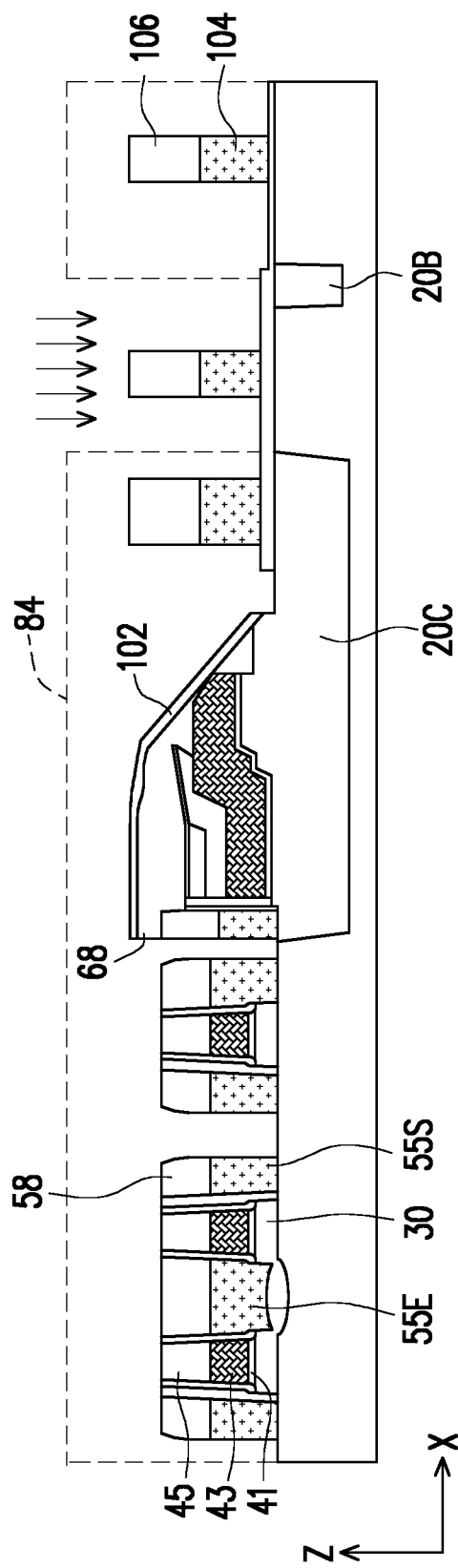
Figure 46:
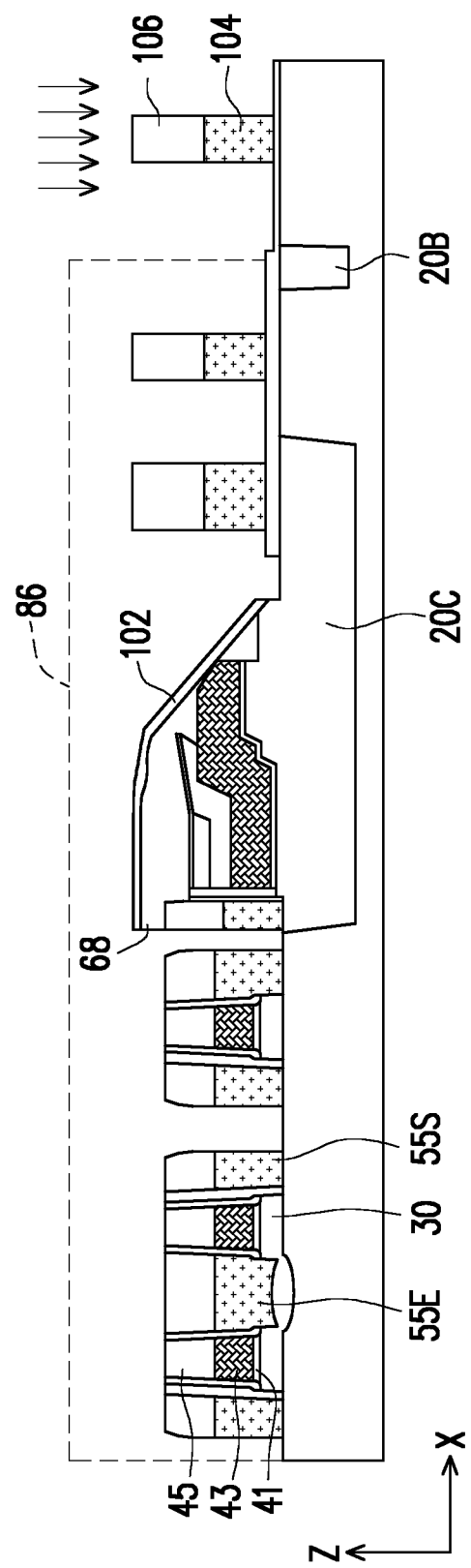

In some embodiments, one or more LDD (lightly doped drain) ion implantation processes are performed through an opening formed in a photo resist layer 84 in the high voltage transistor area HV, as shown in FIG. 45, and further, one or more LDD ion implantation processes are performed through an opening formed in a photo resist layer 86 in the standard voltage transistor area SV, as shown in FIG. 46.

Figure 47:
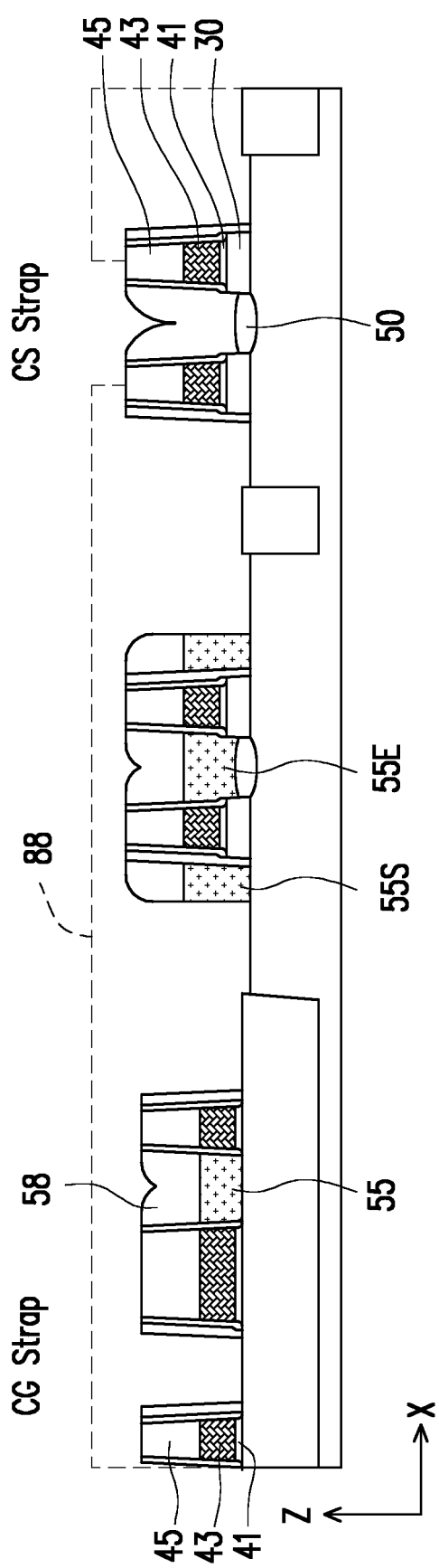
Figure 48:
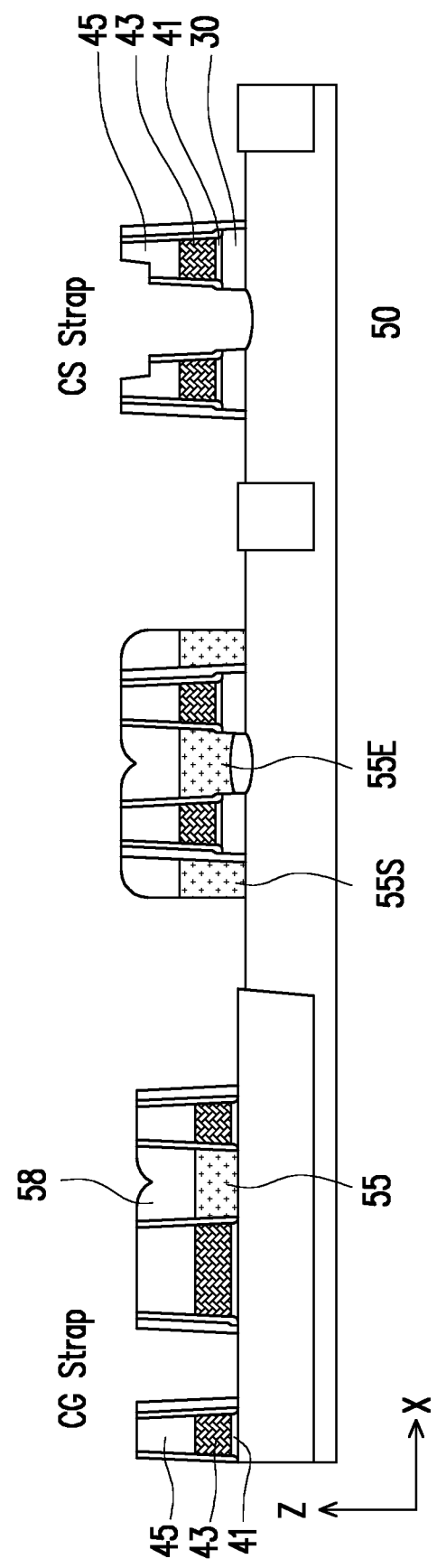

Further, at the cell end portion, a photo resist layer 88 having an opening over an erase gate (common source, CS) strap area is formed as shown in FIG. 47, and by using the photo resist layer 88 as an etching mask, the hard mask layer 58 and the erase gate oxide 50 are removed, as shown in FIG. 48. FIGS. 47 and 49 are cross sectional views at the cell end portion, which is different location from other figures along the Y direction.

Then, as shown in FIG. 49, third sidewall spacers 110 are formed on sidewalls of the select gate 55S and the hard mask layers 58 thereon. In the logic circuit area, gate sidewall spacers 110 are also formed on sacrificial gate structures.

Further, in some embodiments, as shown in FIG. 50, a silicide layer 115 is formed in source/drain regions in the logic circuit area LC and the NVM cell area MC.

Figure 51:
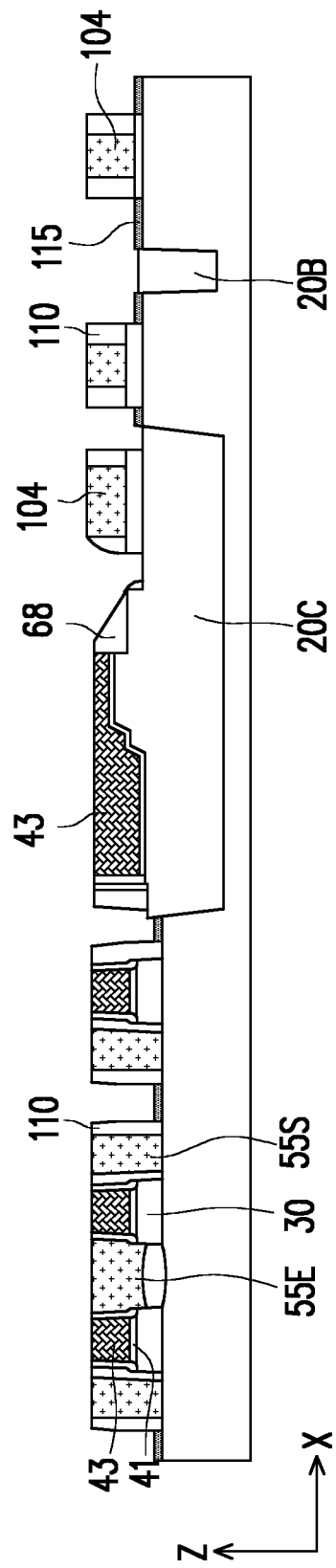

Then, one or more planarization operations are performed to remove the hard mask layer 58 the protective layer 68 and the hard mask layer 106, as shown in FIG. 51. In some embodiments, a resist etch-back operation is performed. In other embodiments, a CMP operation is performed. By the planarization operation, the polysilicon layer 104 in the logic circuit area, and the polysilicon layer of the erase gate 55E and the select gate 55S are exposed. Further, the polysilicon layer 43 of the control gate and the polysilicon layer 43 in the transition area (dummy structure) are also exposed.

Figure 52:
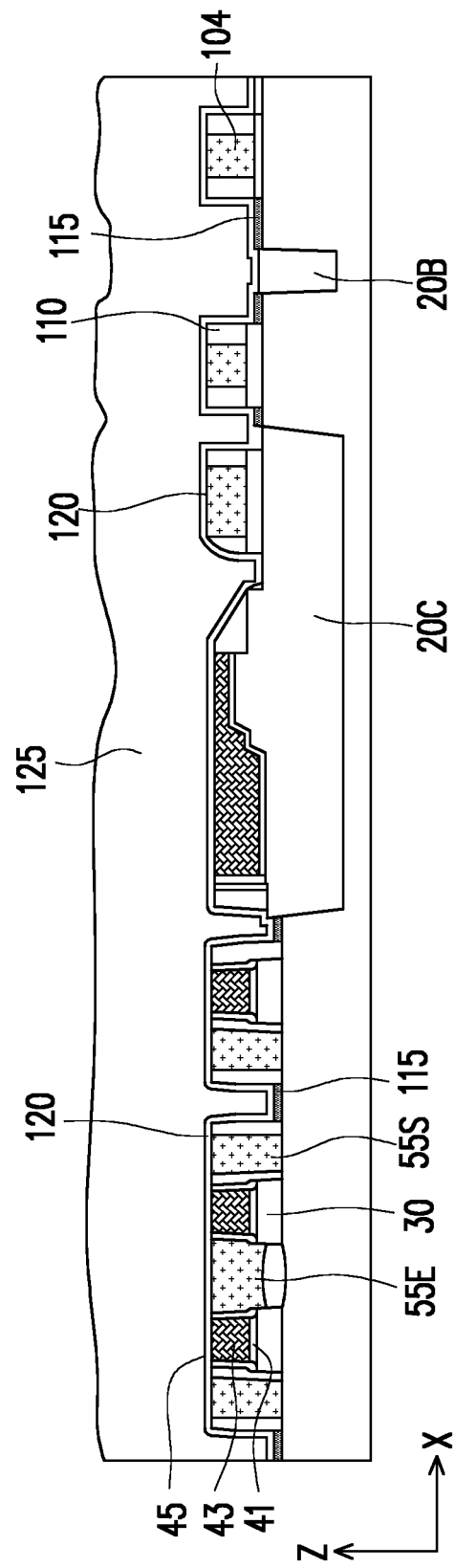

Subsequently, an etch stop layer 120 made of, for example, silicon nitride, is formed, and then one or more interlayer dielectric (ILD) layers 125 are formed, as shown in FIG. 52. The ILD layer 125 includes one or more of a silicon oxide based material including silicon dioxide (SiO$_2$), SiON, SiCO or SiOCN, or other low-k materials.

Figure 53:
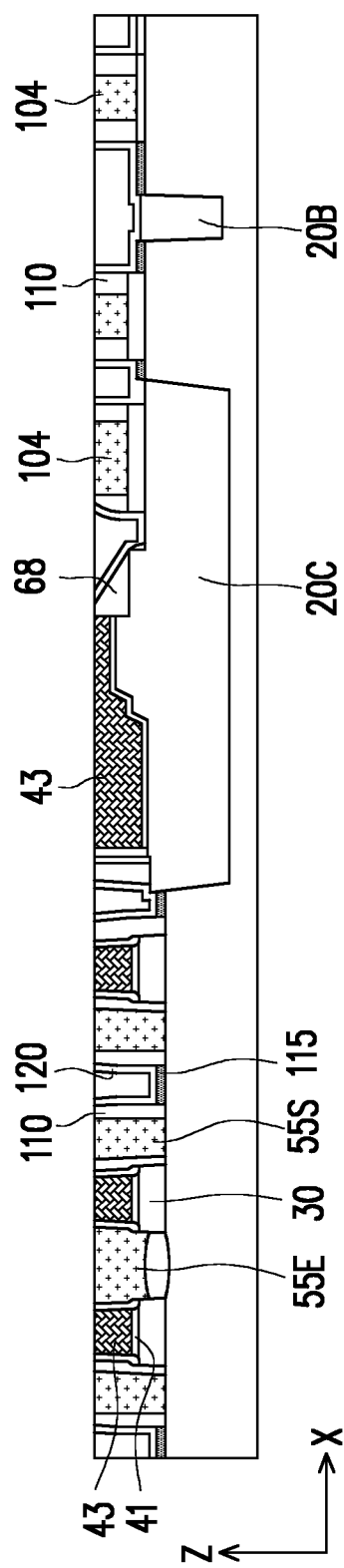

Then, a planarization operation, such as a CMP operation, is performed to expose the polysilicon layers 104 (sacrificial gate layer) in the logic circuit area LC, and to expose the polysilicon layer 43 of the control gate, and the polysilicon layers 55E, 55S of the erase gate and select gate in the NVM cell area MC, as shown in FIG. 53.

Figure 54:
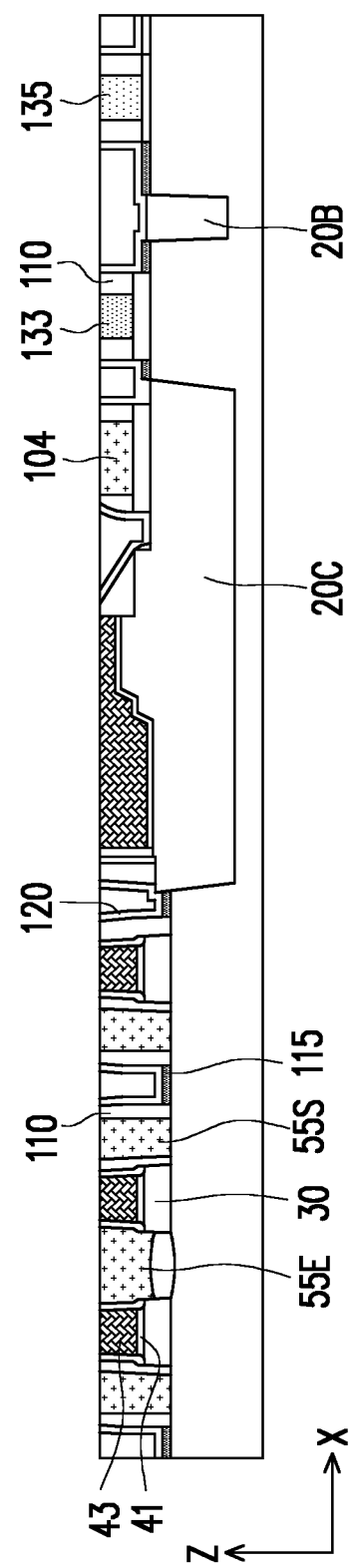

A replacement gate process is then performed as shown in FIG. 54. The sacrificial gate layer is removed in the logic circuit area to form gate spaces formed by the gate sidewall spacers 110. One or more conductive layers are formed by, for example, by CVD, PVD, electroless plating, electroplating, or some other suitable growth or deposition processes. A planarization is then performed on the conductive layers until the ILD layer is reached. The planarization may, for example, be performed by a CMP or some other suitable planarization processes. In some embodiments, one or more layers of the gate electrode 133 in the high threshold voltage ares HV is different from one or more layer of the gate electrode 135 in the standard threshold voltage area SV.

In some embodiments, the gate silicon oxide layer is also removed and a high-k dielectric layer is formed in the gate spaces. In some embodiments, the high-k dielectric layer is hafnium oxide. Similarly, in the NVM cell area, the polysilicon layer of one or more of the control gate, the erase gate and the select gate is fully or partially removed to form gate spaces, and one or more conductive layers are formed in the gate spaces.

Figure 55:
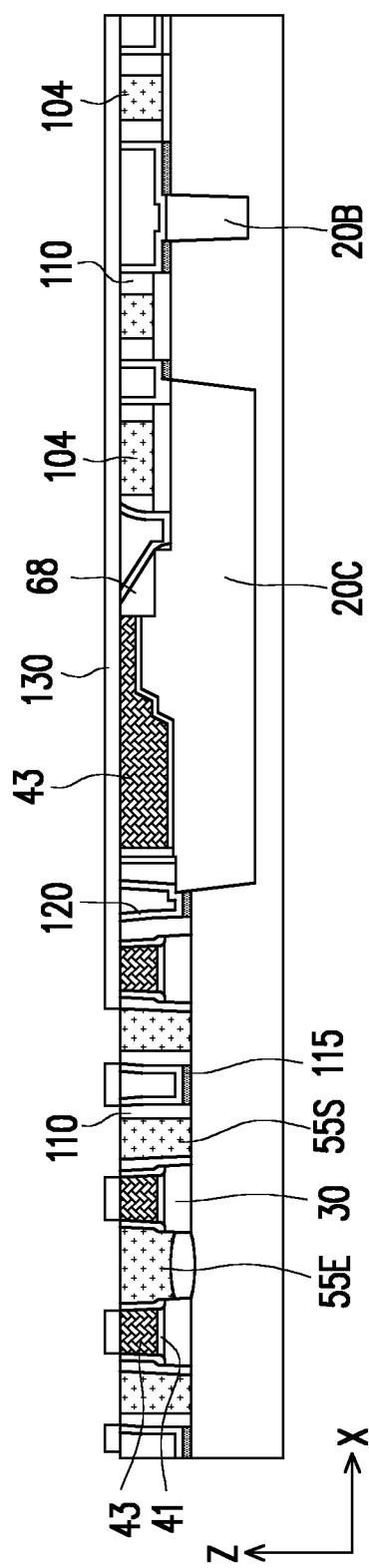
Figure 56:
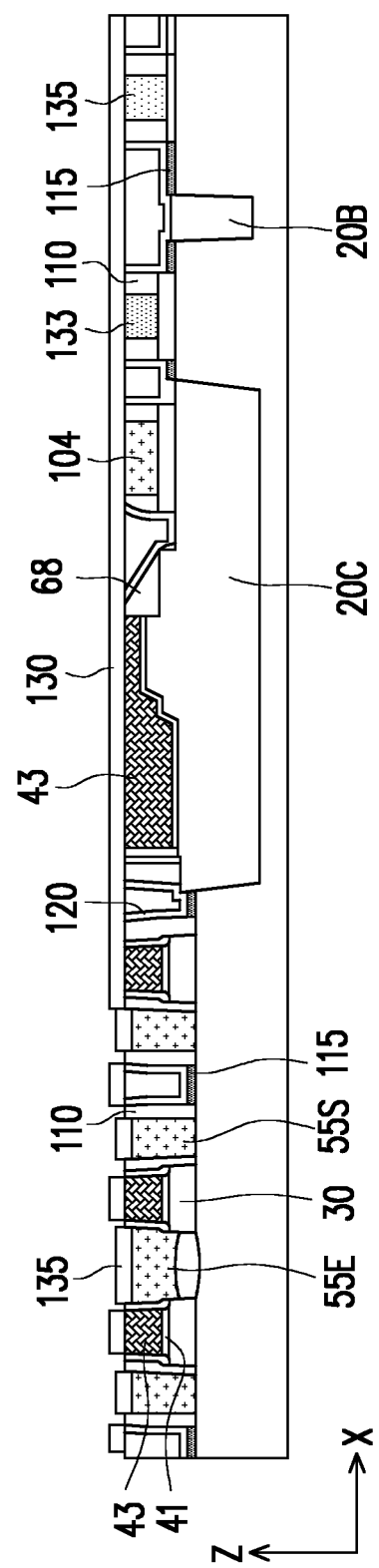

Further, an insulating mask layer 130 is formed and by using one or more lithography and etching operations, openings are formed over the polysilicon layers 55E and 55S in the NVM cell area as shown in FIG. 55. Then, a silicide layer 135 is formed on the the polysilicon layers 55E and 55S in the NVM cell area as shown in FIG. 56. Subsequently, one or more ILD layers are formed, and then contact plugs CP and wrings CW are formed as shown in FIG. 1.

It is understood that further CMOS processes are performed to form various features such as interconnect metal layers, dielectric layers, passivation layers, etc.

The various embodiments or examples described herein offer several advantages over the existing art. By using an additional plasma cleaning operation to remove polymers generated by an etch-back operation of a polysilicon layer, it is possible to suppress the occurrence of defects and improve the yield of semiconductor manufacturing operations.

It will be understood that not all advantages have been necessarily discussed herein, no particular advantage is required for all embodiments or examples, and other embodiments or examples may offer different advantages.

In accordance with one aspect of the present disclosure, a semiconductor device includes a non-volatile memory cell formed in a memory cell area of a substrate, a first circuit formed in a first circuit area of the substrate and an isolation insulating layer disposed between the memory cell area and the first circuit area. An upper surface of the isolation insulating layer includes at least three horizontal surfaces having different vertical levels. In one or more of the foregoing and the following embodiments, the at least three horizontal surfaces include a top surface, a first middle surface lower than the top surface and a bottom surface lower than the first middle surface. The top surface is located closer to the first circuit area than the first middle surface and the bottom surface. The bottom surface is located closer to the memory cell area than the first middle surface and the bottom surface. In one or more of the foregoing and the following embodiments, the upper surface of the isolation insulating layer further comprises a first step and a first slope. In one or more of the foregoing and the following embodiments, the first step connects the top surface and the first middle surface, and the first slope connects the first middle surface and the bottom surface. In one or more of the foregoing and the following embodiments, the upper surface of the isolation insulating layer further comprises a second step. The first slope connects the top surface and the first step, the first step connects the first slope and the first middle surface, and the second step connects the first middle surface and the bottom surface. In one or more of the foregoing and the following embodiments, the upper surface of the isolation insulating layer further comprises a second step and a second middle surface lower than the first middle surface and higher than the bottom surface. The first step connects the top surface and the first middle surface, the second step connects the first middle surface and the second middle surface, and the first slope connects the second middle surface and the bottom surface. In one or more of the foregoing and the following embodiments, the upper surface of the isolation insulating layer further comprises a second step and a second slope. The first slope connects the top surface and the first step, the first step connects the first slope and the second slope, the second slope connects the first step and the first middle surface, and the second step connects the first middle surface and the bottom surface. In one or more of the foregoing and the following embodiments, the isolation insulating layer at least partially embedded in the substrate, and a topology of a bottom surface of the isolation insulating layer in contact with the substrate is different from a topology of the upper surface of the isolation insulating layer. In one or more of the foregoing and the following embodiments, the bottom surface of the isolation insulating layer in contact with the substrate has two horizontal portions connected by a slope.

In accordance with another aspect of the present disclosure, a semiconductor device includes a non-volatile memory cell formed in a memory cell area of a substrate, a first circuit formed in a first circuit area of the substrate, and an isolation insulating layer disposed between the memory cell area and the first circuit area. An upper surface of the isolation insulating layer comprises a first step and a first slope, and the first step and the first slope are covered by one or more dielectric layers made having a same configuration as one or more dielectric layers disposed between a floating gate and a control gate of the non-volatile memory cell. In one or more of the foregoing and the following embodiments, the one or more dielectric layers includes a silicon nitride layer disposed between two silicon oxide layers. In one or more of the foregoing and the following embodiments, the first step and the first slope are further covered by a polysilicon layer disposed on the one or more dielectric layers. In one or more of the foregoing and the following embodiments, the first step is located at a lower level than the first slope. In one or more of the foregoing and the following embodiments, the first step is located at a higher level than the first slope. In one or more of the foregoing and the following embodiments, the upper surface of the isolation insulating layer further comprises a second step, and the second step is not covered by the one or more dielectric layers. In one or more of the foregoing and the following embodiments, a first device forming surface of the substrate in the first circuit area is located at a higher level than a device forming surface of the substrate in the memory cell area.

In accordance with another aspect of the present disclosure, in a method of manufacturing a semiconductor device, an initial step is formed on an upper surface of a substrate at a transition area between a memory cell area and a circuit area. An isolation insulating layer is formed in the transition area. The isolation insulating layer includes an upper surface having a slope disposed between a top portion and a bottom portion. A polysilicon layer is formed over the substrate. A thickness of the polysilicon layer is reduced. A mask layer is formed over a part of the transition area and over the circuit area. An etch-back process is performed to further reduce the thickness of the polysilicon layer. A plasma cleaning operation is performed. A wet treatment operation is performed to partially etch the isolation insulating layer in the transition area. After the wet etching treatment, the mask layer is removed. In one or more of the foregoing and the following embodiments, the mask layer includes a photo resist pattern, and during the plasma cleaning operation, the photo resist pattern shrinks. In one or more of the foregoing and the following embodiments, an edge of the photo resist pattern before the etch-back process is located at the slope. In one or more of the foregoing and the following embodiments, an edge of the photo resist pattern before the etch-back process is located at the top portion or a boundary between the top portion and the slope.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including:
a non-volatile memory cell formed in a memory cell area of a substrate;
a first circuit formed in a first circuit area of the substrate; and
an isolation insulating layer disposed between the memory cell area and the first circuit area, wherein:
an upper surface of the isolation insulating layer comprises four horizontal surfaces having different vertical levels,
the four horizontal surfaces include a top surface, a first middle surface lower than the top surface, a second middle surface lower than the first middle surface and a bottom surface lower than the second middle surface, and
the top surface, the first middle surface, the second middle surface and the bottom surface are arranged in this order from the first circuit.

2. The semiconductor device of claim 1, wherein a horizontal length of the bottom surface is longer than horizontal lengths of the first middle surface and the second middle surface.

3. The semiconductor device of claim 1, wherein the upper surface of the isolation insulating layer further comprises a first slope connecting the second middle surface and the bottom surface.

4. The semiconductor device of claim 3, wherein a height difference between the second middle surface and the bottom surface is greater than a height difference between the first middle surface and the second middle surface.

5. The semiconductor device of claim 4, wherein the height difference between the second middle surface and the bottom surface is greater than a height difference between the top surface and the first middle surface.

6. The semiconductor device of claim 1, wherein:
the isolation insulating layer is at least partially embedded in the substrate, and a topology of a bottom surface of the isolation insulating layer in contact with the substrate is different from a topology of the upper surface of the isolation insulating layer.

7. The semiconductor device of claim 6, wherein the bottom surface of the isolation insulating layer in contact with the substrate has two horizontal portions connected by a slope.

8. The semiconductor device of claim 1, wherein the bottom surface is higher than an upper surface of the substrate in the memory cell area.

9. A semiconductor device including:
- a non-volatile memory cell formed in a memory cell area of a substrate;
- a first circuit formed in a first circuit area of the substrate; and
- an isolation insulating layer disposed between the memory cell area and the first circuit area, wherein:
- an upper surface of the isolation insulating layer comprises horizontal surfaces including a top surface, a middle surface lower than the top surface and a bottom surface lower than the middle surface,
- the top surface and the middle surface are connected by a slope and a first step,
- the middle surface and the bottom surface are connected by a second step, and
- a horizontal length of the bottom surface is longer than a horizontal length of the middle surface.

10. The semiconductor device of claim 9, wherein the horizontal surfaces are covered by one or more dielectric layers having a same number of layers and made of same material as one or more dielectric layers disposed between a floating gate and a control gate of the non-volatile memory cell.

11. The semiconductor device of claim 10, wherein the one or more dielectric layers includes a silicon nitride layer disposed between two silicon oxide layers.

12. The semiconductor device of claim 9, wherein a step height of the first step is smaller than a step height of the second step.

13. The semiconductor device of claim 9, wherein a horizontal width of the middle surface is in a range from 1 nm to 100 nm.

14. The semiconductor device of claim 9, wherein a horizontal width of the slope is in a range from 1 nm to 50 nm.

15. The semiconductor device of claim 9, wherein the bottom surface is higher than an upper surface of the substrate in the memory cell area.

16. A method of manufacturing a semiconductor device, the method comprising:
- forming a trench in a substrate at a transition area between a memory cell area and a circuit area;
- forming an isolation insulating layer by filling the trench with an insulating material, the isolation insulating layer including an upper surface having a slope disposed between a top portion and a bottom portion;
- forming at least two steps on the upper surface of the isolation insulating layer between the top portion and the bottom portion; and
- forming one or more dielectric layers and a polysilicon layer over an entirety of an upper surface of the isolation insulating layer.

17. The method of claim 16, wherein the at least two steps are formed by a plasma process and a wet etching process.

18. The method of claim 17, further comprising performing a first patterning operation on the polysilicon layer and at least one of the one or more dielectric layers.

19. The method of claim 18, wherein the one or more dielectric layers includes a bottom layer, a middle layer and a top layer, and
the middle layer and the bottom layer are not patterned over the isolation insulating layer in the first patterning operation.

20. The method of claim 19, further comprising performing a second patterning operation on the middle layer and the bottom layer.

* * * * *